United States Patent
Honma

(10) Patent No.: US 8,649,222 B2
(45) Date of Patent: Feb. 11, 2014

(54) NONVOLATILE SEMICONDUCTOR MEMORY DEVICE WHICH TRANSFERS A PLURALITY OF VOLTAGES TO MEMORY CELLS AND METHOD OF WRITING THE SAME

(71) Applicant: Kabushiki Kaisha Toshiba, Minato-ku (JP)

(72) Inventor: Mitsuaki Honma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/909,286

(22) Filed: Jun. 4, 2013

(65) Prior Publication Data

US 2013/0258773 A1 Oct. 3, 2013

Related U.S. Application Data

(63) Continuation of application No. 12/855,134, filed on Aug. 12, 2010, now Pat. No. 8,482,983.

(30) Foreign Application Priority Data

Aug. 13, 2009 (JP) ................................ 2009-187824

(51) Int. Cl.
*G11C 11/34* (2006.01)
(52) U.S. Cl.
USPC ............ 365/185.19; 365/185.18; 365/185.22; 365/185.24
(58) Field of Classification Search
USPC .............. 365/185.19, 185.18, 185.22, 185.24
See application file for complete search history.

(56) References Cited

U.S. PATENT DOCUMENTS

| | | | |
|---|---|---|---|
| 6,046,934 A | 4/2000 | Lin | |
| 6,853,585 B2 * | 2/2005 | Lee et al. | 365/185.22 |
| 6,925,004 B2 * | 8/2005 | Shibata et al. | 365/185.03 |
| 6,937,520 B2 * | 8/2005 | Ono et al. | 365/185.18 |
| 6,954,380 B2 * | 10/2005 | Ono et al. | 365/185.24 |
| 7,116,581 B2 | 10/2006 | Suzuki et al. | |
| 7,323,741 B2 * | 1/2008 | Otsuga et al. | 257/316 |
| 7,474,565 B2 | 1/2009 | Huang et al. | |
| 7,492,641 B2 | 2/2009 | Hosono et al. | |
| 7,633,804 B2 * | 12/2009 | Nobunaga | 365/185.19 |
| 7,656,710 B1 * | 2/2010 | Wong | 365/185.19 |
| 7,686,633 B2 | 3/2010 | Yu et al. | |
| 7,830,698 B2 | 11/2010 | Chen et al. | |
| 7,885,107 B2 * | 2/2011 | Park et al. | 365/185.03 |

(Continued)

FOREIGN PATENT DOCUMENTS

| | | |
|---|---|---|
| JP | 6-21404 | 1/1994 |
| JP | 7-37395 | 2/1995 |

(Continued)

*Primary Examiner* — Viet Q Nguyen
(74) *Attorney, Agent, or Firm* — Oblon, Spivak, McClelland, Maier & Neustadt, L.L.P.

(57) ABSTRACT

According to one embodiment, a nonvolatile semiconductor memory device includes a memory cell array, a bit line, and a voltage generator. The memory cell array includes each of a plurality of memory cells. Each of the memory cells includes a charge storage layer and a control gate and is capable of holding two or more levels of data. The bit line is capable of transferring data to the memory cells in a one-to-one correspondence. The voltage generator carries out a verify operation by applying a verify voltage to the memory cells after performing first writing by applying a first voltage and then a second voltage lower than the first voltage to the control gate.

9 Claims, 16 Drawing Sheets

(56) References Cited

U.S. PATENT DOCUMENTS

| | | | |
|---|---|---|---|
| 7,907,452 B2 * | 3/2011 | Park et al. | 365/185.19 |
| 7,948,805 B2 * | 5/2011 | Won et al. | 365/185.22 |
| 8,085,587 B2 * | 12/2011 | Lim | 365/185.03 |
| 8,238,160 B2 * | 8/2012 | Kim et al. | 365/185.18 |
| 8,254,168 B2 | 8/2012 | Suzuki et al. | |
| 2010/0195387 A1 | 8/2010 | Park | |
| 2011/0051510 A1 * | 3/2011 | Honma | 365/185.03 |
| 2011/0216599 A1 | 9/2011 | Namiki et al. | |

FOREIGN PATENT DOCUMENTS

| | | |
|---|---|---|
| JP | 2007-4861 | 1/2007 |
| JP | 2008-226421 | 9/2008 |
| WO | WO 2008/002832 A2 | 1/2008 |

\* cited by examiner

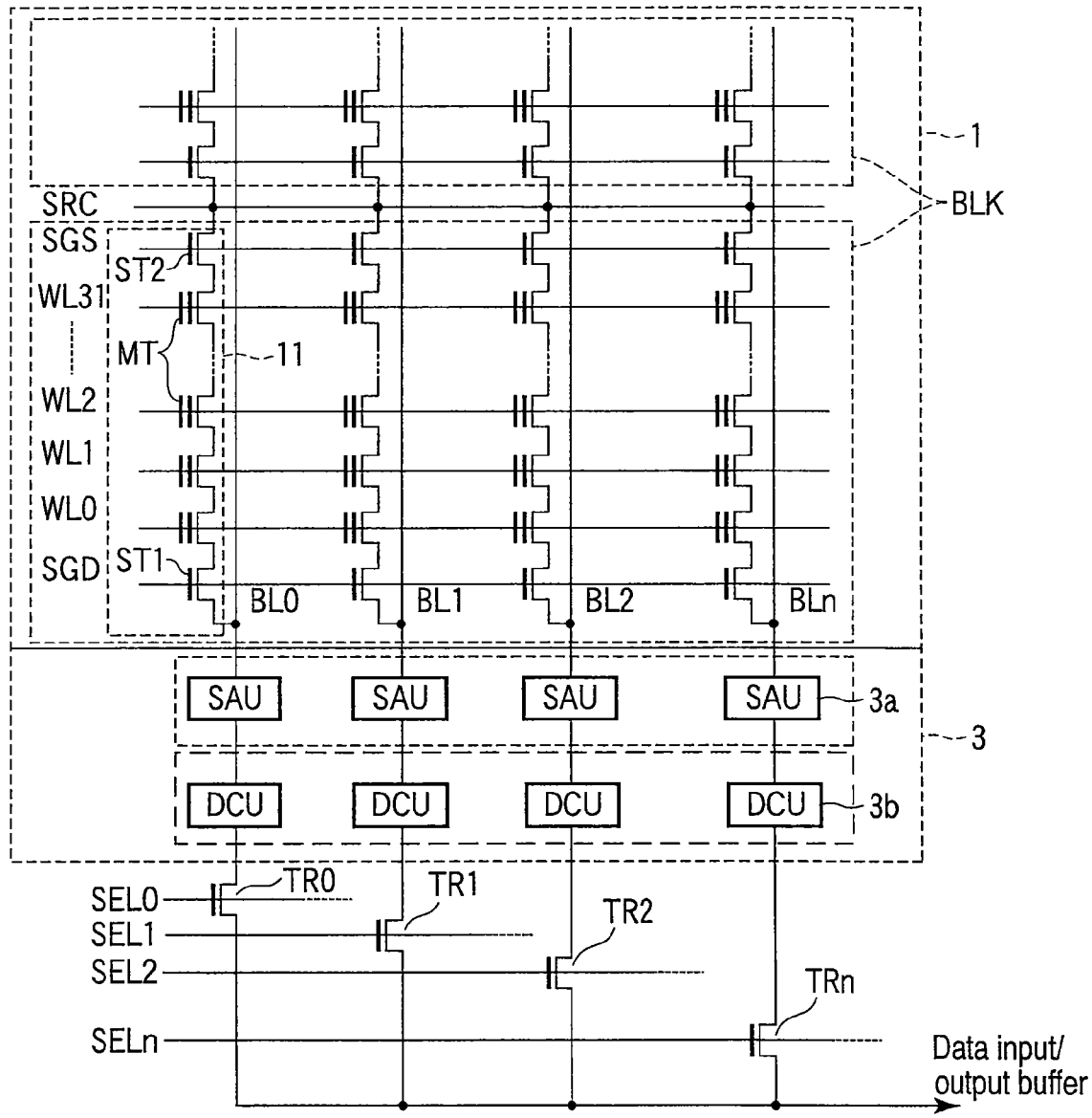
F I G. 2

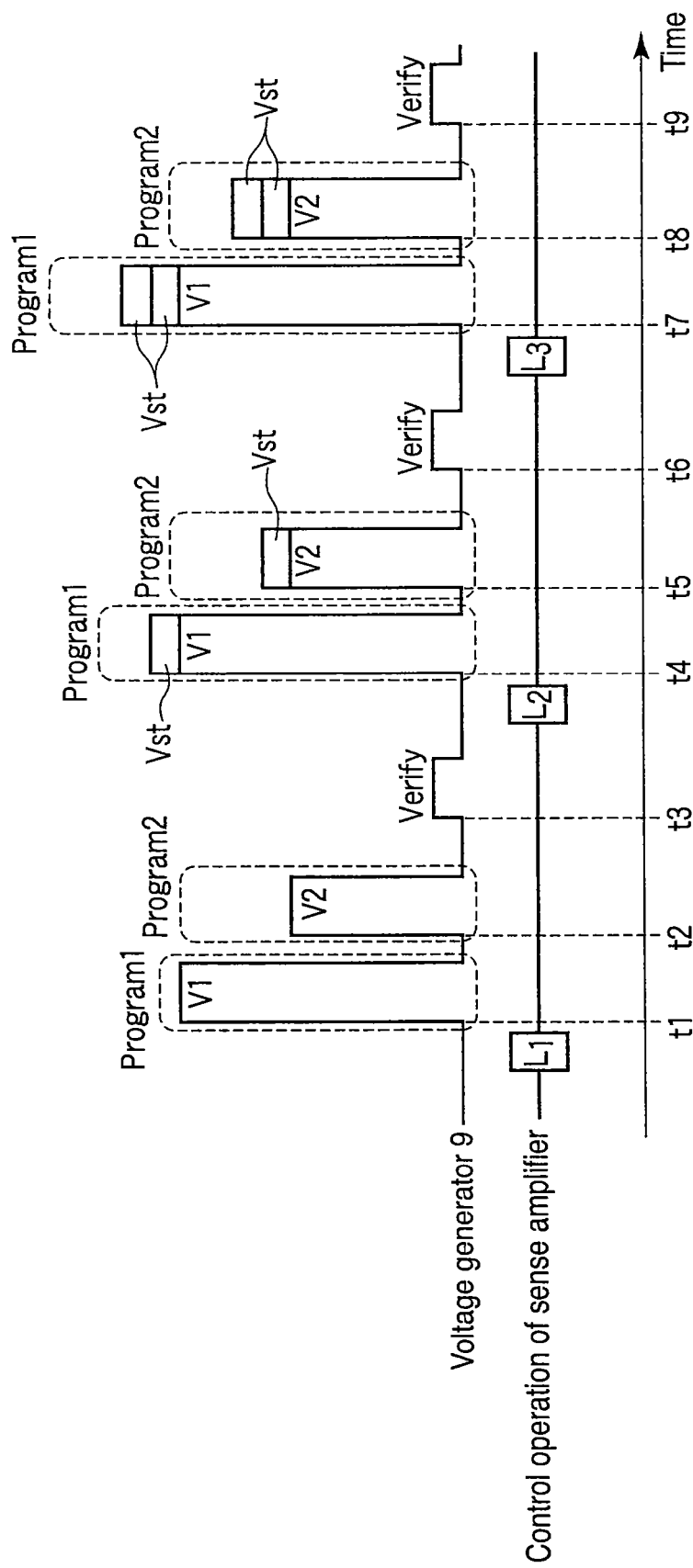
F I G. 6

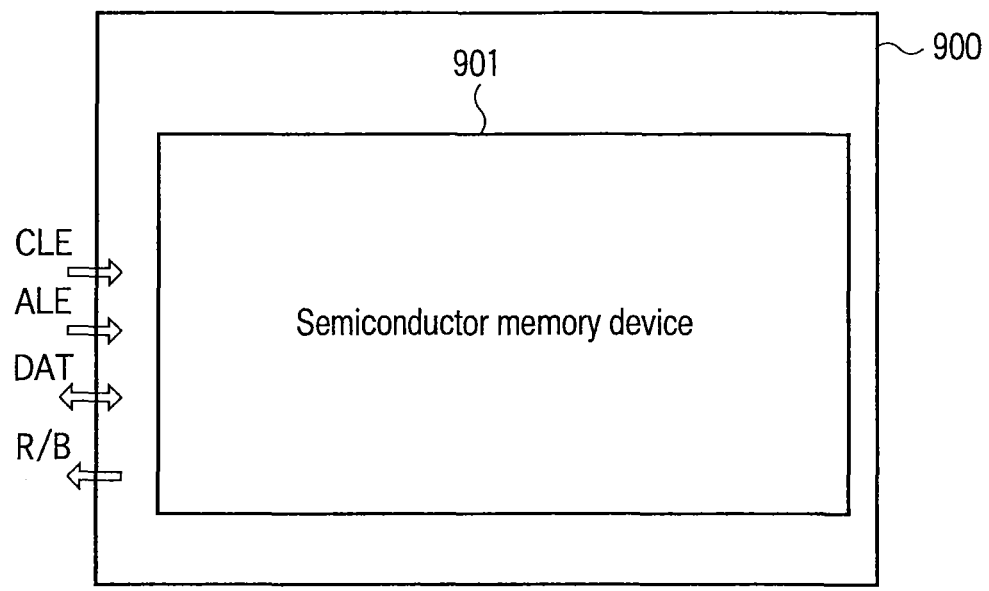
F I G. 13
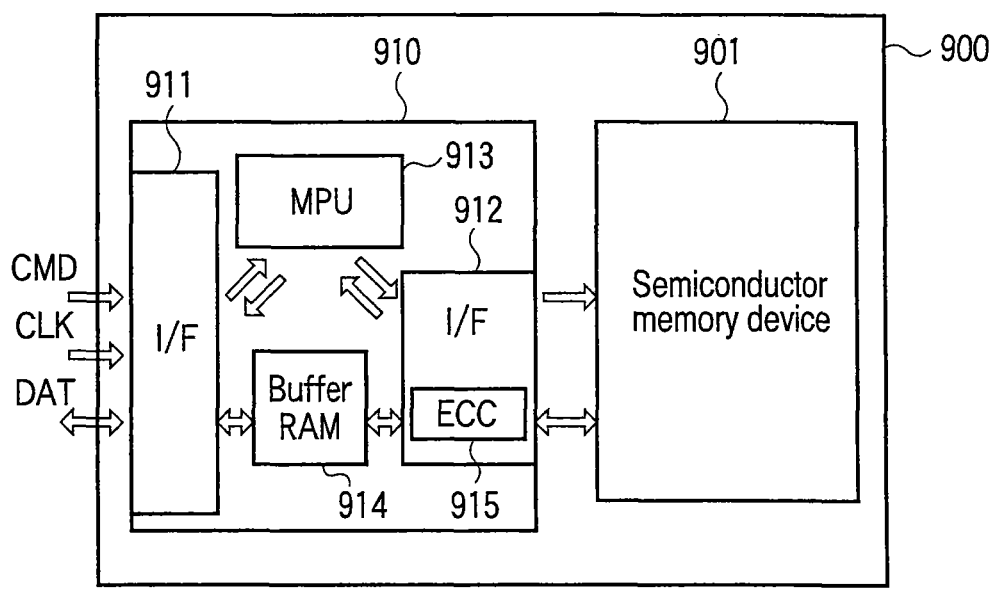
F I G. 14

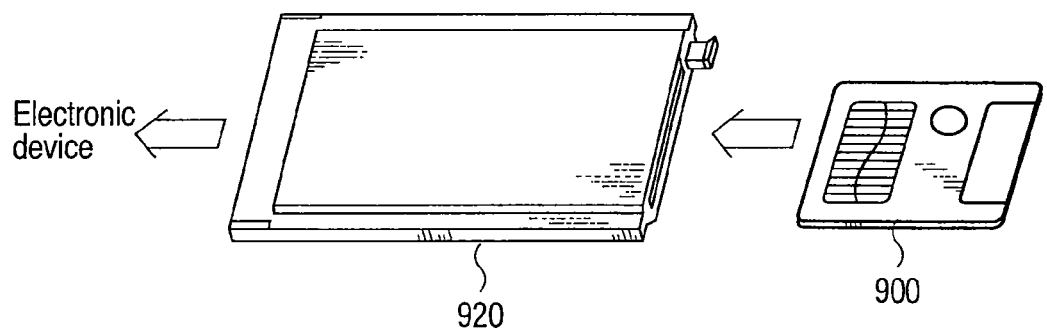
F I G. 15
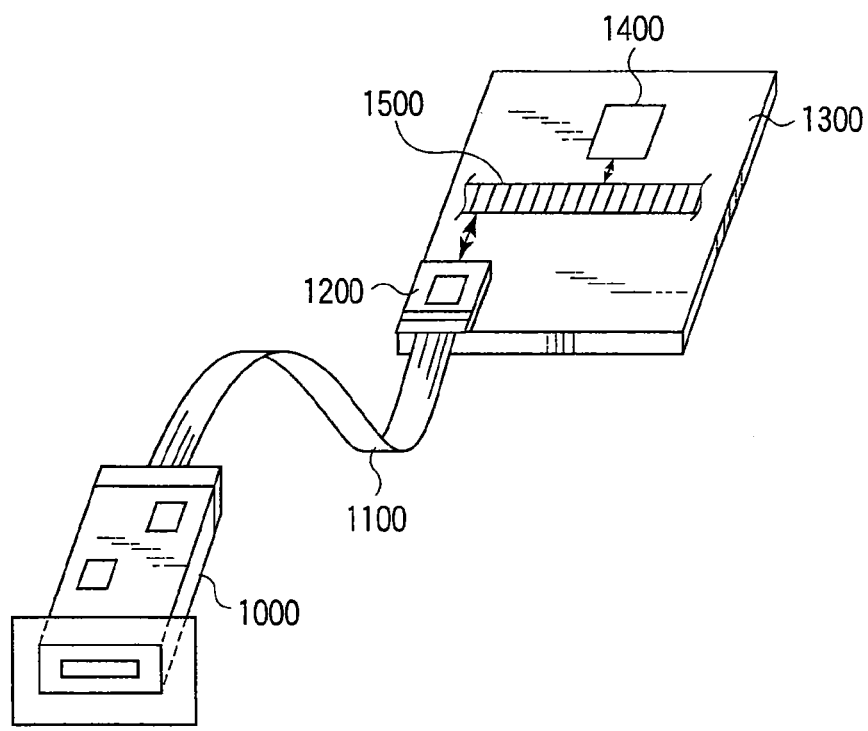
F I G. 16

NONVOLATILE SEMICONDUCTOR MEMORY DEVICE WHICH TRANSFERS A PLURALITY OF VOLTAGES TO MEMORY CELLS AND METHOD OF WRITING THE SAME

CROSS-REFERENCE TO RELATED APPLICATIONS

This application is a continuation of U.S. application Ser. No. 12/855,134 filed Aug. 12, 2010, now U.S. Pat. No. 8,482,983 and is based upon and claims the benefit of priority from Japanese Patent Application No. 2009-187824, filed Aug. 13, 2009; the entire contents of each of which are incorporated herein by reference.

FIELD

Embodiments described herein relate generally to a nonvolatile semiconductor memory device, such as a NAND flash memory, and a method of writing the same.

BACKGROUND

With the recent miniaturization of memory cell transistors MT, the number of electrons trapped in the charge storage layer by a voltage applied to the control gate of the memory cell transistor MT has been decreasing. If the number of trapped electrons varies, this will affect the threshold level of the memory cell transistor MT significantly. That is, a variation in the number of trapped electrons will lead to a decrease in the operation reliability of the memory cell transistors MT as a whole, which has been disclosed in Pat. Appln. KOKAI Publication No. 7-37395.

BRIEF DESCRIPTION OF THE DRAWINGS

FIG. 2 is a block diagram of a memory cell array and a sense amplifier according to the first embodiment;

FIG. 6 is a time chart to explain voltage transfer in a voltage generator according to the first embodiment;

FIG. 13, FIG. 14, FIG. 15, FIG. 16, FIG. 17, FIG. 18, FIG. 19, FIG. 20, FIG. 21, and FIG. 22 are a configuration diagram showing an application to which a semiconductor memory device according to the first to third embodiments is applied.

DETAILED DESCRIPTION

In general, according to one embodiment, a nonvolatile semiconductor memory device includes a memory cell array, a bit line, and a voltage generator. The memory cell array includes each of a plurality of memory cells. Each of the memory cells includes a charge storage layer and a control gate and is capable of holding two or more levels of data. The bit line is capable of transferring data to the memory cells in a one-to-one correspondence. The voltage generator carries out a verify operation by applying a verify voltage to the memory cells after performing first writing by applying a first voltage and then a second voltage lower than the first voltage to the control gate.

With the embodiment, when externally supplied data is written into a memory cell transistor MT specified by an externally supplied address, a voltage is applied to the memory cell transistor MT a plurality of times, thereby eliminating a variation in the threshold level distribution of the memory cell transistor MT and narrowing the threshold level distribution.

[First Embodiment]

Figure 1:
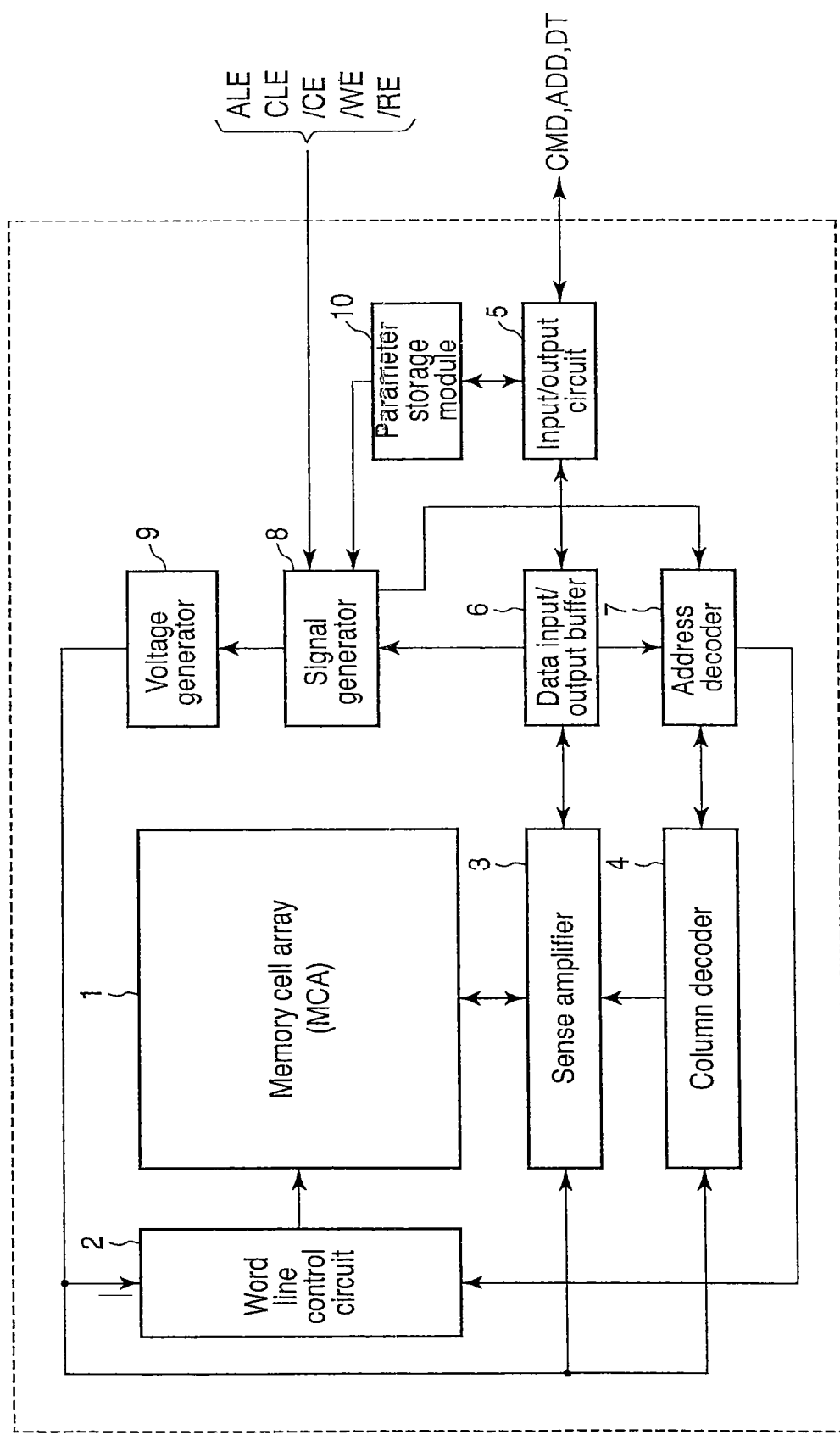
FIG. 1 is a block diagram of a NAND flash memory according to a first embodiment.

A nonvolatile semiconductor memory device according to a first embodiment and a method of writing the same will be explained with reference to FIG. 1. FIG. 1 schematically shows the configuration of a semiconductor memory device according to the first embodiment. In the explanation below, like parts are indicated by corresponding reference numerals throughout all the views of the drawings.

As shown in FIG. 1, the semiconductor memory device of the first embodiment includes a memory cell array 1 (written as MCA in FIG. 1), a word line control circuit 2, a sense amplifier 3, a column decoder 4, an input/output circuit 5, a data input/output buffer 6, an address decoder 7, a signal generator 8, a voltage generator 9, and a parameter storage module 10. First, the memory cell array 1 will be explained.

<Memory Cell Array 1>

In FIG. 1, the memory cell array 1 is a semiconductor memory which includes nonvolatile memory cell transistors MT capable of holding, for example, two or more levels of data. The memory cell array 1 is, for example, a NAND flash memory. The control gate of a memory cell transistor MT is connected to a word line WL. One end of the current path of the memory cell transistor MT is connected to a bit line BL. The configuration of the memory cell array 1 will be explained in detail with reference to FIG. 2.

<Word Line Control Circuit 2>

The word line control circuit 2 functions as a row decoder. Specifically, the word line control circuit 2 selects a row direction of the memory cell array 1 and transfers a necessary voltage generated by the voltage generator 9 to the selected memory cell transistor MT.

<Sense Amplifier 3>

The sense amplifier 3 is connected to the bit lines BL of the memory cell array 1. The sense amplifier 3 has the function of reading and writing data from and into the memory cell transistors MT.

<Column Decoder 4>

The column decoder 4 outputs a column selection signal for selecting a bit line of the memory cell array 1 according to an output signal of the address decoder 7.

<Input/Output Circuit 5 and Data Input/Output Buffer 6>

A host unit (not shown) supplies various commands, an address signal, and write data to the input/output circuit 5. When data is written, the input/output circuit 5 supplies write data to the sense amplifier 3 via the data input/output buffer 6. When data is read, the data read into the sense amplifier 3 is supplied to the input/output circuit 5 via the data input/output buffer 6. Then, the input/output circuit 5 outputs the data to the host unit (not shown).

An address signal supplied from the input/output circuit 5 to the data input/output buffer 6 is supplied to the address decoder 7.

A command supplied from the input/output circuit 5 to the data input/output buffer 6 is supplied to the signal generator 8. The host unit (not shown) supplies external control signals, including a chip enable signal /CE, a write enable signal /WE, a read enable signal /RE, an address latch enable signal ALE, and a command latch enable signal CLE, to the signal generator 8.

<Address Decoder 7>

The data input/output buffer 6 supplies an address signal to the address decoder 7. The address signal decoded by the address decoder 7 is supplied to the word line control circuit 2 and column decoder 4.

<Signal Generator 8>

On the basis of an external control signal and a command, the signal generator 8 generates a control signal for controlling the sequence of writing and erasing data and a control signal for controlling the reading of data. The signal generator 8 supplies the control signals to the voltage generator 9 and address decoder 7.

<Voltage Generator 9>

According to various control signals supplied from the signal generator 8, the voltage generator 9 generates voltages necessary for various operations of the memory cell array 1, sense amplifier 3, and column decoder 4, including a read voltage, a write voltage, a verify voltage, and an erase voltage.

The voltage generator 9 generates not only voltage V1 serving as, for example, a write voltage, but also voltage V2 at least lower than voltage V1 and voltage V3 at least lower than voltage V2.

<Parameter Storage Module 10>

The parameter storage module 10, which is connected to the input/output circuit 5 and signal generator 8, stores a parameter suitable for the quality of a chip determined in a test process.

<Details of Memory Cell Array 1 and Sense Amplifier 3>

FIG. 2 is a block diagram of the memory cell array 1 and sense amplifier 3.

In the memory cell array 1, each of blocks BLK0 to BLKs includes a plurality of NAND strings 11 each composed of nonvolatile memory cell transistors MT connected in series. Each of the NAND strings includes, for example, 32 memory cell transistors MT and select transistors ST1, ST2.

Each of the memory cell transistors MT has a floating gate (FG) structure comprising a charge storage layer (e.g., conductive material), formed via a gate insulating film above a semiconductor substrate, an interlayer insulating film formed on the charge storage layer, and a control gate electrode formed on the interlayer insulating film.

Each of the memory cell transistors MT may have a MONOS structure comprising a charge storage layer (e.g., an insulating film), formed via a gate insulating film above a semiconductor substrate, an insulating film (hereinafter, referred to as a block layer) which is formed on the charge storage layer and whose permittivity is higher than that of the charge storage layer, and a control gate electrode formed on the block layer.

The number of memory cell transistors MT is not limited to 32 and may be 64, 128, and 256. The number of memory cell transistors MT is not restrictive.

Adjacent memory cell transistors MT share a source and a drain. The memory cell transistors MT are arranged between select transistors ST1, ST2 in such a manner that their current paths are connected in series.

The drain on one end side of the memory cell transistors MT connected in series is connected to the source of select transistor ST1 and the source on the other end side is connected to the drain of select transistor ST2.

The control gate electrodes of memory cell transistors MT in the same row are connected equally to any one of word lines WL0 to WL31. The gate electrodes of select transistors ST1 of the memory cell transistors MT in the same row are connected equally to select gate line SGD1. The gate electrodes of select transistors ST2 of the memory cell transistors MT in the same row are connected equally to select gate line SGS1. To simplify the explanation, when there is no need to distinguish between word lines WL0 to WL31, they will simply be referred to as word lines WL. In the memory cell array 11, the drains of the select transistors ST1 in the same column are connected equally to any one of bit lines BL0 to BLn (n is a natural number). Hereinafter, when there is no need to distinguish between bit lines BL0 to BLn, they will simply be called bit lines BL. The sources of the select transistors ST2 are connected equally to source line SL.

Data is written or read en bloc into or from a plurality of memory cell transistors MT connected to the same word line WL. This unit is called a page. Data is erased from a plurality of NAND strings 11 simultaneously in blocks BLK.

Next, the sense amplifier 3 will be explained. The sense amplifier 3 includes a plurality of sense amplifier units (written as SAU in FIG. 2) 3a and a plurality of data control units (written as DCU in FIG. 2) 3b.

When data is read, each of the sense amplifier units 3a senses data read from the memory cell transistor MT onto bit line BL and then holds the read data temporarily.

Thereafter, the sense amplifier unit 3a transfers the read data to the data input/output buffer 6 via data control unit 3b.

The sense amplifier unit 3a holds data supplied from the data control unit 3b temporarily and transfers the data to bit line BL.

The data control unit 3b holds write data supplied from the outside. The data control unit 3b holds data read from the sense amplifier unit 3a.

Specifically, when data is written and read, the data control unit 3b not only causes data latch circuits 0DL, 1DL, 2DL to hold data but also processes the held data. Specifically, the data control unit 3b may perform the following operations on the held data: logical multiplications "AND" and "NAND," logical sum "OR," and inversion.

One end side of the current paths of MOS transistors TR0 to MRn is connected to data control unit 3b. The other end side of the current paths is connected to data input/output buffer 6. When there is no need to distinguish between MOS transistors TR0 to TRn, they will simply be called MOS transistors TR.

Column selection signals SEL0 to SELn are supplied to the gates of MOS transistors TR0 to TRn. Specifically, column selection signals SEL0 to sELn are supplied to the gates of the MOS transistors TR, turning on the MOS transistors TR, which causes data held in the sense amplifier units 3a corresponding to the MOS transistors TR to be transferred to the data input/output buffer.

In a write operation (sometimes referred to as a program operation), a read operation, and a program verify operation (sometimes referred to as a verify operation), not only is bit line BL connected to sense amplifier unit 3a selected, but also any one of word lines WL0 to WL31 is selected. A write or a read voltage is applied to all of the memory cell transistors MT connected the selected word line WL, causing all the memory cell transistors MT to be written into or read from simultaneously.

While in FIG. 2, sense amplifier unit 3a has been connected to bit line BL, this embodiment is not limited to this. For example, one sense amplifier unit 3a may be provided for, for example, two bit lines BL. In addition, although data control circuit 3b is connected to sense amplifier unit 3a, this embodiment is not limited to this. For instance, one data control circuit 3b may be provided for, for example, eight sense amplifiers and the data control circuit 3b may be selectively connected to sense amplifier unit 3a.

Next, a threshold level distribution of the memory cell transistor MT will be explained with reference to FIG. 3.

Figure 3:
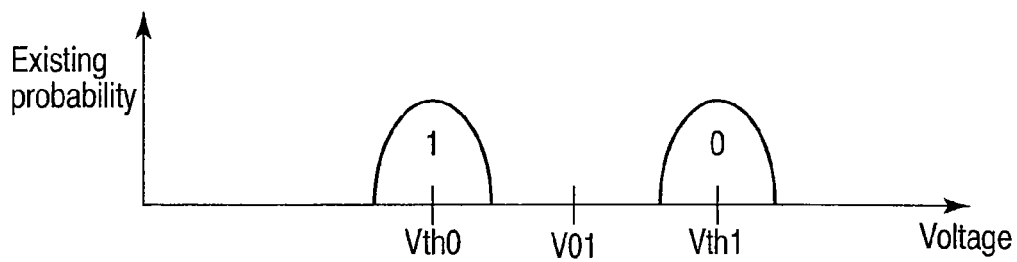
FIG. 3 shows a threshold level distribution of a memory cell transistor according to the first embodiment.

In FIG. 3, a threshold level distribution is plotted on the abscissa axis and the number of memory cell transistors MT is shown on the ordinate axis.

As shown in FIG. 3, each of the memory cell transistors MT may hold 2-level data (1-bit data). That is, the memory cell transistor MT may hold two data items, "1" and "0," in ascending order of threshold voltage Vth.

Threshold voltage Vth0 of "1" data in the memory cell transistor MT satisfies the expression Vth0<V01. Threshold voltage Vth1 of "0" data satisfies the expression V01<Vth1. That is, the memory cell transistor MT is configured to be capable of holding 1-bit data, "0" data and "1" data, according to the threshold level. The threshold voltage is varied by injecting charges into the charge storage layer. The memory cell transistor MT may be configured to be capable of holding 4 or more levels of data.

<Details of Sense Amplifier Unit 3a>

Figure 4:
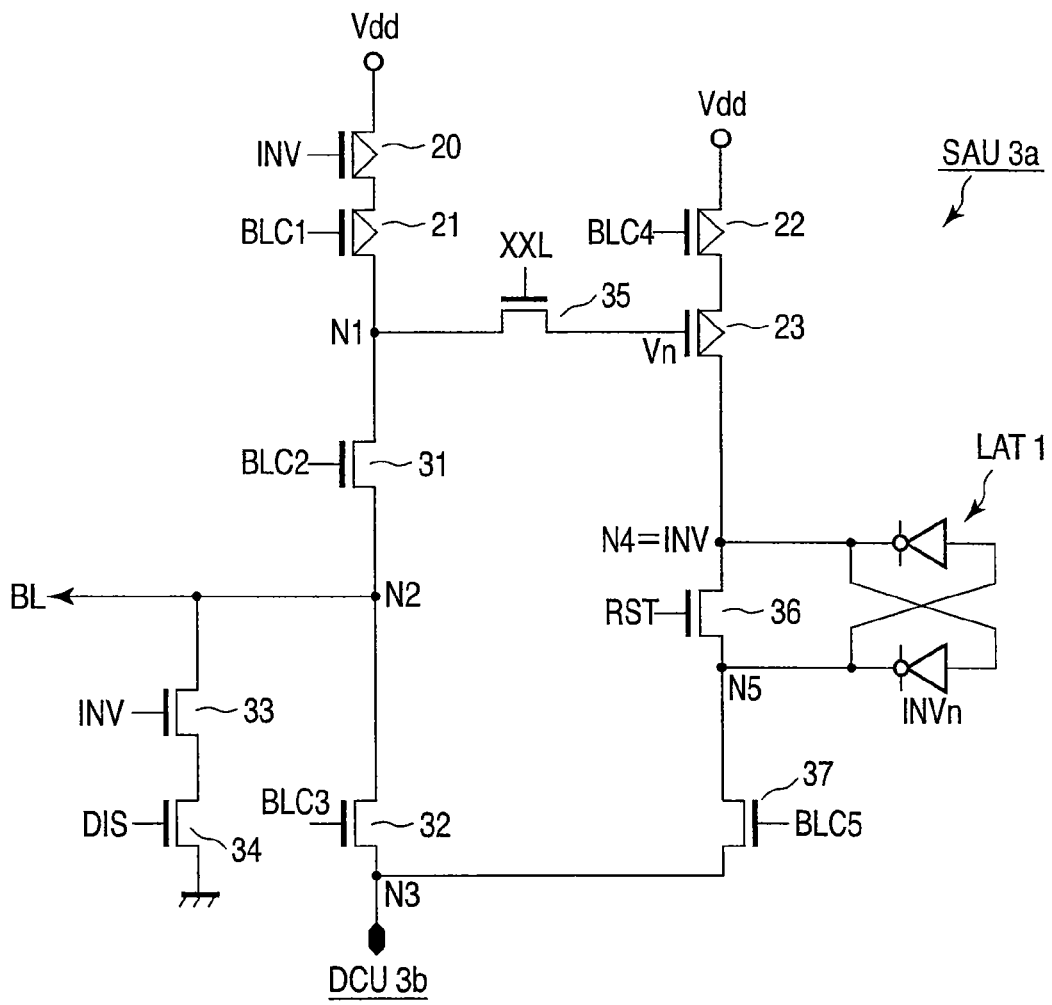
FIG. 4 is a circuit diagram of a sense unit according to the first embodiment.

Next, sense amplifier unit (written as SAU in FIG. 2) 3a will be explained with reference to FIG. 4. FIG. 4 is a circuit diagram of sense amplifier unit 3a. As shown in FIG. 4, sense amplifier unit 3a comprises p-channel MOS transistors 20 to 23, n-channel MOS transistors 31 to 37, and latch circuit LAT1 composed of, for example, a clocked inverter circuit.

Voltage Vdd is supplied to one end of the current path of MOS transistor 20. The other end of the current path of MOS transistor 20 is connected to one end of the current path of MOS transistor 21. Signal INV is supplied to the gate of MOS transistor 20. Signal INV is supplied from node N4 described later. That is, signal INV supplied to the gate of MOS transistor 20 is determined by, for example, a high potential or a low potential at node N4.

The other end of the current path of MOS transistor 21 is connected to node N1. Signal BLC1 is supplied to the gate of MOS transistor 21. One end of the current path of MOS transistor 31 and the other end of the current path of MOS transistor 21 are connected equally to node N1. The other end of the current path of MOS transistor 31 is connected to node N2. Signal BLC2 is supplied to the gate of MOS transistor 31.

Node N2 is connected to bit line BL. One end of the current path of MOS transistor 32 and the other end of the current path of MOS transistor 31 are connected equally to node N2. The other end of the current path of MOS transistor 32 is connected via node N3 to data control unit 3b. Signal BLC3 is supplied to the gate of MOS transistor 32.

One end of the current path of MOS transistor 35 is connected to node N1 and the other end is connected to the gate of MOS transistor 23. Signal XXL is supplied to the gate of MOS transistor 35. The potential at the other end of the current path of MOS transistor 35, that is, at the gate of MOS transistor 23, is set at voltage Vn3.

Voltage Vdd is supplied to one end of the current path of MOS transistor 22 and the other end of the current path of memory cell transistor 22 is connected to one end of the current path of MOS transistor 23. Signal BLC4 is supplied to the gate of MOS transistor 22.

The other end of the current path of MOS transistor 23 is connected via node N4 to latch circuit LAT1. Signal INV is supplied to node N4. That is, signal INV becomes high or low according to the potential at node N4. In other words, signal INV goes into a high or a low state according to the state of latch circuit LAT1 connected to node N4. One end of the current path of MOS transistor 36 is connected to node N4 and the other end is connected to node N5. Signal RST is supplied to the gate of MOS transistor 36. One end of the current path of MOS transistor 37 and the other end of the current path of MOS transistor 36 are connected equally to node N5. The other end of the current path of MOS transistor 37 and the other end of the current path of MOS transistor 32 are connected equally to node N3. The other end of the current path of MOS transistor 37 is further connected to data control unit 3b.

One end of the current path of MOS transistor 33 is connected to node N2. Signal INV of latch circuit LAT1 is supplied to the gate of MOS transistor 33. That is, signal INV supplied to the gate of MOS transistor 33 is determined by the state of node N4.

One end of the current path of MOS transistor 34 is connected to the other end of the current path of MOS transistor 33. The other end of the current path of MOS transistor 34 is grounded. Signal DIS is supplied to the gate of MOS transistor 34.

Figure 5:
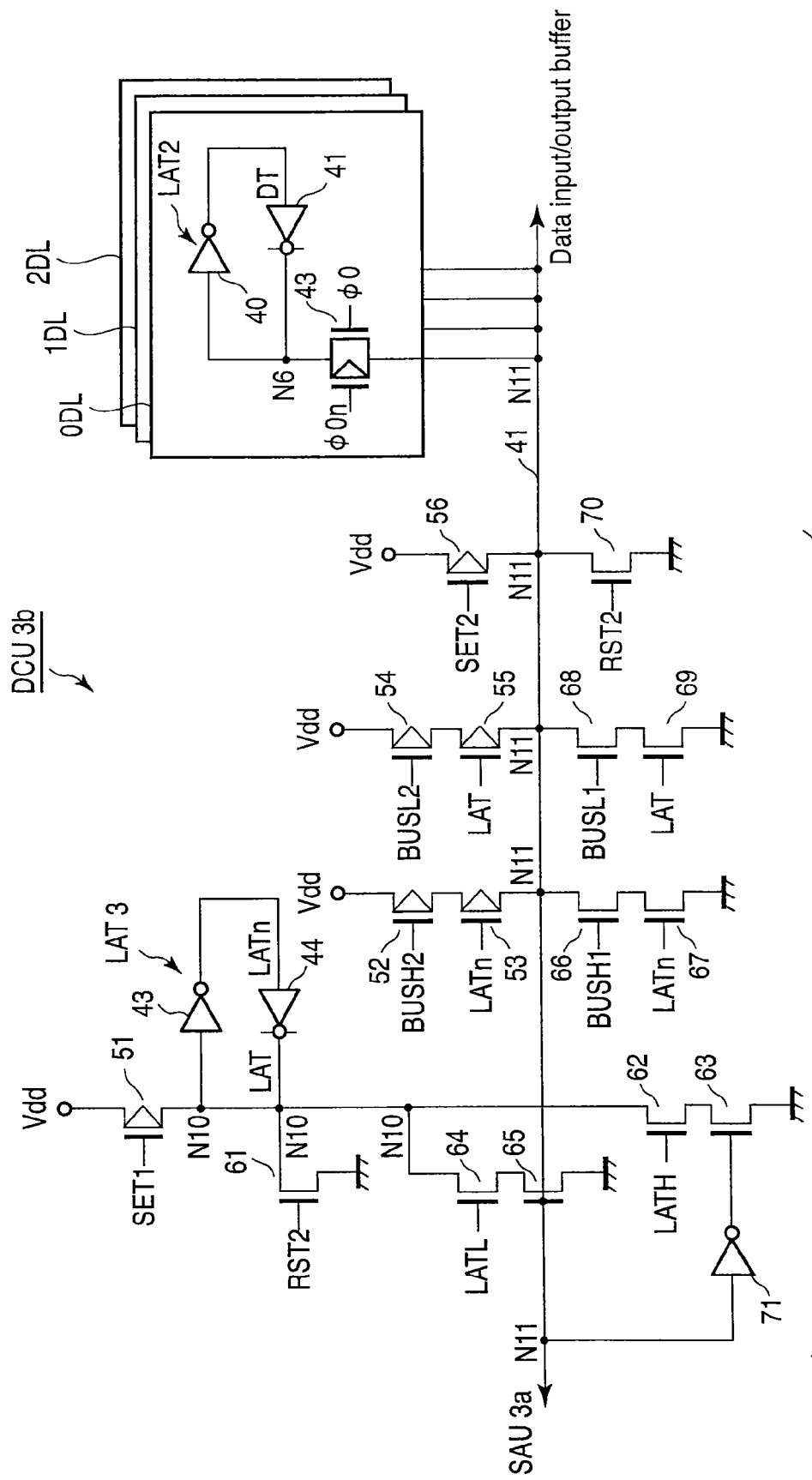
FIG. 5 is a circuit diagram of a data control unit according to the first embodiment.

Next, data control unit (written as DCU in FIG. 2) 3b will be explained with reference to FIG. 5. FIG. 5 is a circuit diagram of data control unit 3b.

As shown in FIG. 5, data control unit 3b functions as a data cache. Data control unit 3b includes, for example, three data latch circuits 0DL, 1DL, 2DL, a data bus 41, and a data creation circuit 42. One end of data bus 41 (node N11 in FIG. 5) is connected to sense amplifier unit 3a (node N3 in FIG. 4) and the other end is connected to the data input/output buffer.

Data latch circuit 0DL includes inverters 40, 41 p-channel MOS transistor 42, and n-channel MOS transistor 43. A signal at node N6 is input to the input end of inverter 40. The output of inverter 40 is input to inverter 41. The output of inverter 41 is output to node N6. That is, inverters 40, 41 combine to function as latch circuit LAT2.

One end of the current path of MOS transistor 43 is connected to node N6 and the other end is connected via node N11 to the data input/output buffer. Signal φ0 is supplied to the gate of MOS transistor 43. One end of the current path of MOS transistor 42 and one end of the current path of MOS transistor 43 are connected equally to node N6. The other end of the current path of MOS transistor 43 and the other end of the current path of MOS transistor 42 are connected equally to node N11. Inversion signal φn of signal φ0 is supplied to the gate of MOS transistor 43. MOS transistors 42 and 43 combine to function as a transfer gate. The configuration of data latch circuit 0DL has been explained. Each of data latch circuits 1DL, 2DL has the same configuration as that of data latch circuit 0DL, except that a signal supplied to the transfer gate differs. Accordingly, data latch circuits 0DL, 1DL, 2DL may be selectively connected to data bus 41.

Next, the configuration of data creation circuit 42 will be explained. Data creation circuit 42 comprises a latch circuit LAT3, p-channel MOS transistors 51 to 56, n-channel MOS transistors 61 to 70, and an inverter circuit 71. Power supply Vdd is supplied to one end of the current path of MOS transistor 51 and the other end is connected to node N10. Set signal SET1 is supplied to the gate of MOS transistor 51. Latch circuit LAT3, which is connected to node N10, is composed of inverters 43, 44. As shown in FIG. 5, node N10 is connected to the input end of inverter 43. Output signal LATn of inverter 43 is input to inverter 44. Output signal LAT of inverter 44 is output to node N10. One end of the current path of MOS transistor 61 is connected to node N10 and the other end is grounded. Reset signal RST2 is supplied to the gate of MOS transistor 61. One end of the current path of MOS transistor 64 is connected to node N10. The other end of the current path of MOS transistor 64 is connected to one end of the current path of MOS transistor 65. Signal LATL is supplied to the gate of MOS transistor 64. The other end of the current path of MOS transistor 65 is grounded. The gate of MOS transistor 65 is connected to data bus 41. One end of the current path of MOS transistor 62, latch circuit LAT3, and one end of the current path of each of MOS transistors 61, 64 are connected equally to node N10. The other end of MOS transistor 62 is connected to one end of the current path of MOS transistor 63. Signal LATH is supplied to the gate of MOS transistor 62. The other end of the current path of MOS transistor 63 is grounded. The gate of MOS transistor 63 is connected to the output end of inverter circuit 71 whose input end is connected to bus 41 at node N11. That is, the other end of the current path of MOS transistor 51 is grounded not only via node N10 and MOS transistor 61 but also via MOS transistors 62, 63 and further via MOS transistors 64, 65.

Voltage Vdd is supplied to one end of the current path of MOS transistor 52 and the other end is connected to one end of the current path of MOS transistor 53. Signal BUSH2 is supplied to the gate of MOS transistor 52. The other end of the current path of MOS transistor 53 is connected to node N11. Signal LATn is supplied to the gate of MOS transistor 53. That is, signal LATn supplied to the gate of MOS transistor 53 is determined by the potential of signal LATn at latch circuit LAT3. The MOS transistors 52, 53 constitute a circuit which charges bus 41 to the high level according to signal BUSH2 and the potential of signal LATn at latch circuit LAT3.

Voltage Vdd is supplied to one end of the current path of MOS transistor 54 and the other end is connected to one end of the current path of MOS transistor 55. Signal BUSL2 is supplied to the gate of MOS transistor 54. The other end of the current path of MOS transistor 55 is connected to node N11. Signal LAT is supplied to the gate of MOS transistor 55. That is, signal LAT supplied to the gate of MOS transistor 55 is determined by the potential of signal LAT at latch circuit LAT3. The MOS transistors 54, 55 constitute a circuit which charges bus 41 to the high level according to signal BUSL2 and the potential of signal LAT at latch circuit LAT3.

Voltage Vdd is supplied to one end of the current path of MOS transistor 56 and the other end is connected to node N11. Set signal SET2 is supplied to the gate of MOS transistor 56. That is, MOS transistor 56 is a circuit which charges bus 41 to the high level according to set signal SET2.

Between one end of the current path of MOS transistor 52 to which power supply Vdd is supplied and data bus 41 (node N11), a series circuit of MOS transistors 52, 53, a series circuit of MOS transistors 54, 55, and MOS transistor 56 are connected.

One end of the current path of MOS transistor 66 is connected to the other end of the current path of MOS transistor 53 at node N11. The other end of the current path of MOS transistor 66 is connected to one end of the current path of MOS transistor 67. Signal BUSH1 is supplied to the gate of MOS transistor 66. The other end of the current path of MOS transistor 67 is grounded. Signal LATn is supplied to the gate of MOS transistor 67. That is, MOS transistors 66, 67 constitute a circuit which discharges bus 41 to the low level according to signal BUSH1 and the potential at node LATn of latch circuit LAT3.

One end of the current path of MOS transistor 68 is connected to the other end of the current path of MOS transistor 55 at node N11. The other end of the current path of MOS transistor 68 is connected to one end of the current path of MOS transistor 69. Signal BUSL1 is supplied to the gate of MOS transistor 68. The other end of the current path of MOS transistor 69 is grounded. Signal LAT is supplied to the gate of MOS transistor 69. That is, MOS transistors 68, 69 constitute a circuit which discharges bus 41 to the low level according to signal BUSL1 and the potential at node LAT of latch circuit LAT3.

One end of the current path of MOS transistor 70 is connected to the other end of the current path of MOS transistor 56 at node N11. The other end of the current path of MOS transistor 70 is grounded. Reset signal RST2 is supplied to the gate of MOS transistor 70. That is, MOS transistor 70 is a circuit which discharges bus 41 to the low level according to reset signal RST2.

Next, a write operation, a read operation, and a write verify operation carried out by sense amplifier unit 3a will be explained. First, a write operation will be explained with reference to FIG. 4.

<Write Operation>

First, a write operation will be outlined. In a write operation, "0" or "1" data held in data control unit 3b is loaded into latch circuit LAT1 of sense amplifier unit 3a. It is determined according to the loaded data whether to bring bit line BL connected to sense amplifier unit 3a into a write enable state (where bit line BL is kept at 0 V) or into a write inhibit state (where bit line BL is kept at a specific potential).

Specifically, if the held data is "0" or at the low level, bit line BL is brought into the write enable state, with the result that "0" data is written into memory cell transistor MT connected to the bit line BL. If the held data is "1" data or at the high level, bit line BL is brought into the write inhibit state. Hereinafter, a write operation will be explained concretely.

<Step 0>

When a control module (not shown) has given a write instruction, reset signal RST is made high temporarily, thereby resetting latch circuit LAT1. That is, node N4, or signal INV, is set at the low level. This turns on MOS transistor 20 and turns off MOS transistor 33.

<Step 1>

Next, signals BLC1, BLC4, and DIS are made low. This turns on MOS transistors 21, 22 and turns off MOS transistor 34. Then, signal BLC2 is made high. This causes voltage Vdd to charge bit line BL via the current path composed of MOS transistors 20, 21, node N1, MOS transistor 31, and node N2, which makes the bit line BL high. Thereafter, signals BLC3 and XXL are made high. That is, MOS transistors 32, 31, 35 are turned on, thereby loading data from data control unit 3b via the current path composed of node N3, MOS transistor 32, nodes N2, N1, and MOS transistor 35.

<Step 2>
<Writing of Data>

If data loaded from data control unit 3b is at the low level "0" indicating write enable, potential Vn of the gate of MOS transistor 23 is made low. As a result, MOS transistor 23 goes on. Accordingly, a high voltage obtained by subtracting the threshold levels of MOS transistors 22, 23 from voltage Vdd, that is, "1," is set in latch circuit LAT1.

Thereafter, signals BLC3 and XXL are each made low. Then, signal DIS is set high. Since MOS transistor 33 is on, the charges charged on bit line BL via MOS transistors 33, 34 are discharged to 0 V. Then, write voltage Vpgm generated by voltage generator 9 is applied via word line control circit 2 to word line WL of the selected memory cell transistor MT. Therefore, in the case of a cell to be written into, the channel is made low (VSS=0 V) and the potential of word line WL is charged to write voltage Vpgm, thereby performing writing. Voltage Vpgm is such a voltage as causes charges to be injected into the charge storage layer. As a result, the threshold level of memory cell transistor MT fluctuates. In this way, when writing "0" data into memory cell transistor MT, sense amplifier unit 3a sets bit line BL at 0 [V]. The potential difference between the control gate of memory cell transistor MT and its channel is adjusted with a write voltage generated by voltage control generator 9 described layer.

<Writing of No Data>

If data loaded from data control unit 3b is at high level "1" indicating the write inhibit state, the potential of the gate of MOS transistor 23 is made high. As a result, MOS transistor 23 is turned off, which sets low level "0" in latch circuit LAT1. In this case, MOS transistor 33 goes off, keeping the potential of bit line BL at the high level. Thereafter, when select line SGD of select gate transistor ST1 which connects the bit line shown in FIG. 2 and NAND string 11 is brought into the high level, a write inhibit voltage corresponding to the high level is transferred via bit line BL to the channel of memory cell transistor MT. As a result, the channel of memory cell transistor MT goes high (Vdd-Vth: Vth is the threshold voltage of select transistor ST1) and the potential of word line WL goes to voltage Vpgm, preventing data from being written.

<Write Verify Operation>

Next, a write verify operation will be explained. A write verify operation of verifying the threshold voltage of memory cell transistor MT after a write operation is almost the same as a read operation described later. Specifically, after a precharge operation described later is carried out to charge bit line BL to the high level, a specific verify voltage, for example, voltage Vcgr, is supplied to the selected word line WL. Voltage Vcgr is a voltage corresponding to data held in memory cell transistor MT.

If the threshold voltage of memory cell transistor MT has reached the verify voltage, memory cell transistor MT is turned off. Accordingly, the potential of bit line BL is held at the high level.

If the threshold voltage of memory cell transistor MT has not reached the verify voltage, memory cell transistor MT is turn on. Voltage Vread generated by voltage generator 9 is transferred via word line control circuit 2 to the unselected word lines WL. This turns on NAND string 11, which makes the potential of bit line BL low. Voltage Vread is a voltage that turns on memory cell transistor MT.

First, signals BLC1, BLC2, XXL are made high and signals BLC4, BLC3, DIS, RST are made low. As a result, the potential of bit line BL is transferred to the gate of MOS transistor 23 via node N2, MOS transistor 31, node N1, and MOS transistor 35. That is, data dependent on the potential of bit line BL is held in latch circuit LAT1.

Specifically, if the threshold voltage of memory cell transistor MT has reached the verify voltage and the potential of bit line BL is high, MOS transistor 23 is turned off. Accordingly, the low level is held in latch circuit LAT1.

If the threshold voltage of memory cell transistor MT has not reached the verify voltage and the potential of bit line BL is low, MOS transistor 23 is turn on. Accordingly, the high level is held in latch circuit LAT1. That is, if the threshold voltage has been verified, the potential of node N4 or signal INV in latch circuit LAT1 is low. If the threshold voltage has not been verified, signal INV is high.

Data of inversion signal INVn at node N4 in latch circuit LAT1 is transferred to data control unit 3b in a state where signal BLC5 is made high and MOS transistor 37 is turned on.

<Read Operation>

Next, a read operation will be explained. Sense amplifier 3 charges bit line BL to a fixed voltage. Thereafter, a read-level voltage is applied to the word line. If the threshold voltage of memory cell transistor MT is lower than the read level, memory cell transistor MT goes on. That is, bit line BL and source line SL go into the conducting state, discharging the bit line BL. This voltage is sensed by sense amplifier 3, which then outputs the inversion result of the sensed data as read data in the form of "1."

In contrast, if the threshold voltage of memory cell transistor MT is higher than the read level, memory cell transistor MT goes off, bringing bit line BL and source line SL into the nonconducting state.

The potential of the bit line BL is sensed by sense amplifier 3, which then outputs the inversion result of the sensed data as read data in the form of "0." That is, read data ("1" or "0") from sense amplifier 3 is transferred to data control unit 3b.

<Precharge>

First, reset signal RST is made high, which causes latch circuit LAT1 to be reset and signal INV to be made low. Thereafter, signals BLC1, BLC3, DIS, XXL are made low and signal BLC2 is made high. That is, voltage Vdd charges bit line BL via the current path composed of MOS transistors 20, 21, node N1, MOS transistor 31, and node N2, which brings the bit line BL into the high level.

<Loading of Data>

Next, signal BLC2 is made low, thereby turning off MOS transistor 31, which stops the charging of bit line BL. Thereafter, the read level is supplied to the selected word line WL. If the threshold voltage of memory cell transistor MT is higher than the read level, memory cell transistor MT is off, which keeps bit line BL high. If the threshold voltage of memory cell transistor MT is lower than the read level, memory cell transistor MT is turned on, which discharges the charges on bit line BL. Accordingly, bit line BL goes low. Then, signal BLC3 is made high, causing the potential of bit line BL to be read into data control unit 3b.

Next, the operation of data control unit 3b will be explained.

<Inversion of Data Stored in Data Latch Circuit>

An inversion operation of inverting data in data latch circuits 0DL to 2DL in FIG. 5 will be explained. First, data bus 41 is charged and transfer gate 43 of any one of data latch circuits 0DL to 2DL is opened. For example, when transfer gate 43 of data latch circuit 0DL is opened, if signal DT of data latch circuit 0DL is high, data bus 41 is discharged via the clocked inverter circuit of data latch circuit 0DL, with the result that data of the inverted signal DT has been transferred to data bus 41.

Next, after latch circuit LAT3 has been reset, signal SET1 is made low, thereby making low the potential at node N10 in latch circuit LAT3, that is, signal LAT.

Next, when signal LATL is made high, if data bus 41 has been discharged according to the data in the latch circuit, node N10, or signal LAT, is kept at the high level, and if data bus 41 remains charged, MOS transistor 65 goes on, discharging signal LAT at node N10 to the low level.

Next, when data bus 41 is charged as described above and signal BUSH1 is made high, if signal LAT at node N10 is high (signal LATn is low), data bus 41 remains high and, if signal LAT at node N10 is low (signal LATn is high), data bus 41 goes low.

Finally, after latch circuit LAT2 of data latch circuit 0DL has been reset, transfer gate 43 is opened, causing the data on data bus 41 to be loaded into latch circuit LAT2 via transfer gate 43. As a result, if data on data bus 41 is at the high level, signal DT goes low. If data on data bus 41 is at the low level, signal DT goes high.

The series of operations is summarized as follows. Inverted data of signal DT of latch circuit LAT2 is transferred to data bus 41. The inverted data is transferred to latch circuit LAT1 of sense amplifier unit 3a. The data in latch circuit LAT1 is transferred to data bus 41. The inverted data on data bus 41 is held in latch circuit LAT2. In this way, signal DT in data latch circuits 0DL to 2DL is inverted.

The basic operation of data control unit 3b is not limited to this. Another operation may be carried out as the basic operation. On the basis of the basic operation, "AND," "NAND," and "OR" operations may be performed on data.

Next, a write voltage generated by voltage generator 9 will be explained with reference to FIG. 6. Voltage generator 9 is controlled by signal generator 8.

FIG. 6 is a time chart to explain voltage Vpgm generated by voltage generator 9. Voltage generator 9 generates voltages V1, V2 (<V1) as voltage Vpgm. Voltage V2 is a voltage which is transferred to the same memory cell transistor MT again after voltage V1 has been transferred. Voltage V2 plays a role in narrowing the threshold level distribution of the memory cell transistor MT.

Narrowing the threshold level distribution is to narrow the potential difference in the threshold level distribution of memory cell transistor MT (the difference between the low voltage side and high voltage side of the distribution) from, for example, 3 V to 40 mV. That is, by narrowing the threshold level distribution, the potential difference in the distribution is narrowed to, for example, about 40 mV, while keeping the number of memory cell transistors MT in the distribution. As shown in FIG. 6, time is plotted on the abscissa axis and voltage is plotted on the ordinate axis. When the low level is transferred to the gate of MOS transistor 23 of sense amplifier unit 3a, that is, in the write enable state (written as "Control operation in sense amplifier" in FIG. 6), voltage generator 9 transfers voltages V1 and V2 as write voltages Vpgm to the control gate of memory cell transistor MT.

Write data is loaded from data control unit 3b into sense amplifier unit 3a. This is shown by "$L_1$" in "Control operation of sense amplifier" in FIG. 6. "n" in "$L_n$" represents the number of writes. After period $L_1$ has elapsed, when time t1 is reached, voltage generator 9 transfers voltage V1 as voltage Vpgm to the selected word line WL. As a result, voltage V1 is applied to the control gate of memory cell transistor MT. Then, at time t2, voltage V2 is applied as voltage Vpgm to the control gate of the memory cell transistor MT. Thereafter, at time t3, a write verify operation is performed on the memory cell transistor MT. Specifically, voltage generator 9 transfers voltage Vcgr to the control gate of memory cell transistor MT and a verify operation is carried out.

How the threshold level distribution of memory cell transistor MT varies with voltages V1, V2 will be explained with reference to FIG. 7.

Figure 7:
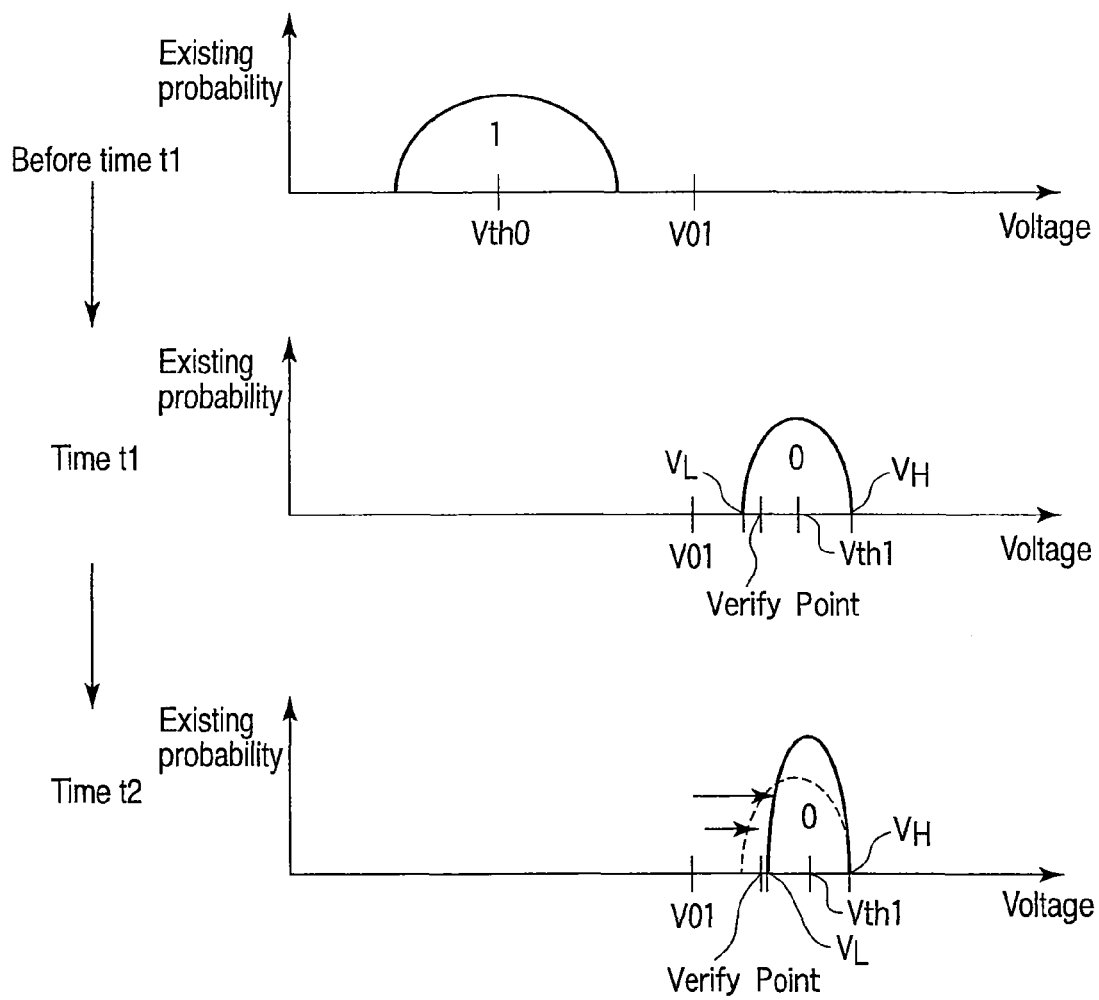
FIG. 7 is a time chart to explain a variation in the threshold level of a memory cell transistor according to the first embodiment.

FIG. 7 shows the way memory cell transistor MT that had "1" data before time t1 varies its threshold level distribution toward "0" data at time t1 and time t2 in the threshold level distribution of memory cell transistor MT shown in FIG. 3.

As shown in FIG. 7, at time t1, the threshold level distribution of memory cell transistor MT lies so as to cross over, for example, a verify point. That is, if a threshold voltage lower than the verify point is $V_L$ and a threshold voltage higher than the verify point is $V_H$, writing is insufficient at time t1 and voltage $V_L$ has not reached the verify point.

At time t2, writing is performed to voltage V2, with the result that voltage $V_L$ has exceeded the verify point. Accordingly, in a verify operation at time t3, it has been determined that "0" data has been written. In FIG. 7, the threshold level of memory cell transistor MT has exceeded the verify point with voltages V1 and V2, that is, the writing of "0" data has been completed.

In this way, when a write verification operation has determined that writing has been completed, node N4 of latch circuit LAT1 is kept at the low level and node N5 is kept at the high level.

However, when voltage $V_L$ of memory cell transistor MT has not exceeded the verify point with voltage V2 at time t2 in FIG. 6 and therefore writing has not been completed, node N4 of latch circuit LAT1 is held at the high level. That is, in period $L_2$, control data unit 3b transfers the low level to the gate of MOS transistor 23. After time t4, voltage generator 9 transfers voltage (V1+$V_{ST}$) and voltage (V2+$V_{ST}$) obtained by adding voltage $V_{ST}$ to voltages V1, V2, respectively, as write voltages Vpgm to the control gate of memory cell transistor MT.

As described above, program voltages V1, V2 are stepped up by voltage $V_{ST}$ and a write verify operation is carried out. If the verify operation has shown that writing has not been completed yet, voltages obtained by adding 2×$V_{ST}$ to voltages V1, V2, respectively, are further transferred to memory cell transistor MT after time t7. Thereafter, at time t9, a verify operation is carried out. In this way, program voltage V1, V2 are stepped up by voltage $V_{ST}$ and a write verify operation is repeated until writing has been completed. While in FIG. 6, voltage V2 is lower than voltage V1, voltage V1 may be equal to voltage V2.

While in the first embodiment, memory cell transistor MT may hold 2 levels of data, it may be configured to be capable of holding 4 levels of data as described above. In this case, the number of distribution states memory cell transistor MT may take is four, including an erased state.

<Effect of the First Embodiment>

A nonvolatile semiconductor memory device of the first embodiment and a method of writing the same produce the effect described in item (1).

(1) Operation Reliability May be Improved (Part 1)

With the nonvolatile semiconductor memory device of the first embodiment, a write operation is carried out using two different voltages. Specifically, before a verify operation is performed, voltage V1 and voltage V2 lower than voltage V1 are applied to the same memory cell transistor MT. There is no problem even if voltage V1 is applied to memory cell transistor MT a plurality of times, provided that "0" data has not been written into the memory cell transistor MT and that voltage V1 is not applied as write voltage Vpgm to memory cell transistor MT a plurality of times. In the case of memory cell transistor MT whose threshold voltage $V_L$ is close to the verify point, the application of voltage V2 is effective. The reason for this is that, if voltage V1 is applied a plurality of times, the verify point might be exceeded and the threshold voltage of memory cell transistor MT close to threshold voltage $V_L$ might exceed voltage $V_H$ significantly, making wider the threshold level distribution of the memory cell transistor MT.

However, with the nonvolatile semiconductor memory device of the first embodiment, since voltage V2 raises the threshold voltage of memory cell transistor MT a little, the broadening of the threshold level distribution of the memory cell transistor MT may be suppressed and narrowed. This is because only a few electrons are trapped with voltage V2 as compared with the electrons trapped in the charge storage layer of memory cell transistor MT as a result of voltage V1 being applied. This is effective in, for example, a multilevel memory. That is, since the threshold level distribution of memory cell transistor MT does not broaden and is narrowed, the problem of reading data erroneously may be solved.

Furthermore, since voltage V2 is transferred to memory cell transistor MT, the potential of bit line BL need not be set to an intermediate potential between the write inhibit voltage and the zero potential in writing data. The potential of bit line BL is set to the intermediate potential to suppress a fluctuation in the threshold level of memory cell transistor MT without changing the voltage transferred to the control gate. In this case, it takes time to verify the threshold level distribution of the memory cell transistor MT once and set a potential transferred to bit line BL. However, with the nonvolatile semiconductor memory device of the first embodiment, since voltage V2 lower than voltage V1 is used, the potential of bit line BL need not be varied according to the threshold level distribution of memory cell transistor MT. That is, an increase in the operation speed may be expected.

Furthermore, after a write verify operation, voltages higher than voltage V1 and voltage V2 output from voltage generator 9 immediately before the write verify operation by voltage $V_{ST}$ are applied to memory cell transistor MT. That is, additional writing is performed. This makes it possible to write "0" data into memory cell transistor MT that has not exceeded the verify point with voltage V1 as shown in FIG. 7. In other words, for example, "0" data may be written into memory cell transistor MT for which it has not been determined in a first write operation that "0" data has been written.

[Second Embodiment]

Next, a nonvolatile semiconductor memory device according to a second embodiment and a method of reading the same will be explained. The second embodiment is such that voltage generator 9 is caused to generate more write voltages Vpgm in writing data in the first embodiment. That is, after not only voltages V1, V2 but also voltage V3 lower than voltages V1, V2 is applied to memory cell transistor MT, a verify operation is performed on the memory cell transistor MT.

<Write Operation>

Figure 8:
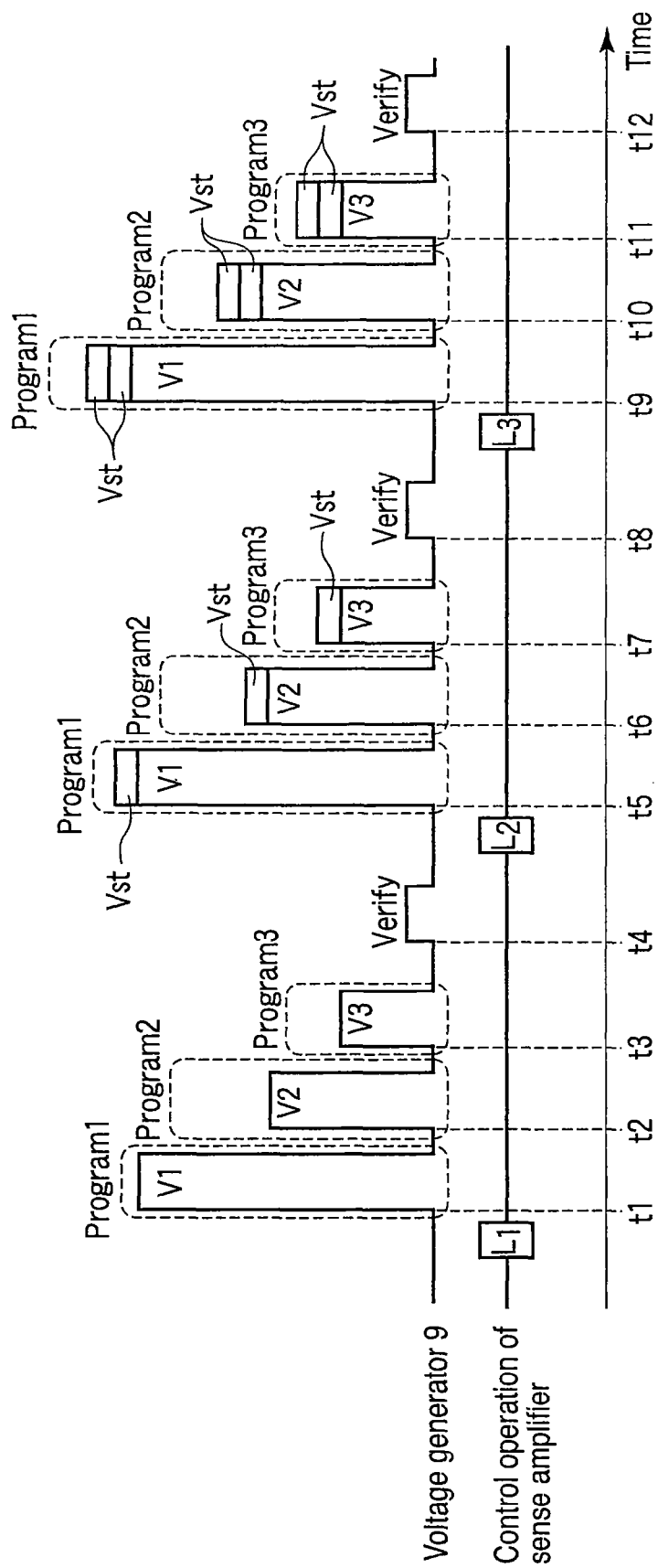
FIG. 8 is a time chart to explain voltage transfer in a voltage generator according to a second embodiment.

FIG. 8 is a timing chart to explain the way voltage generator 9 applies voltages Vpgm to the control gate of memory cell transistor MT via word line control circuit 2. As described above, in the second embodiment, voltages V1 to V3 are applied as voltages Vpgm to the control gate of memory cell transistor MT. As shown in FIG. 8, time is plotted on the abscissa axis and voltage is plotted on the ordinate axis. As in FIG. 6, when the low level is transferred to the gate of MOS transistor 23 of sense amplifier unit 3a, that is, in the write enable state (written as "Control operation of sense amplifier" in FIG. 8), voltage generator 9 applies voltages V1 to V3 as write voltages Vpgm to the control gate of memory cell transistor MT. An explanation of the same operations as in FIG. 6 will be omitted. Only the operations differing from those in FIG. 6 will be explained.

After voltage generator 9 applies voltage V2 to memory cell transistor MT at time t2, it applies voltage V3 lower than voltages V1, V2 to the memory cell transistor MT at time t3. By doing this, memory cell transistor MT that has not exceeded the verify point after the transfer of voltage V2 of FIG. 7 in the first embodiment is written into so as to exceed the verify point, thereby narrowing the threshold level distribution of the memory cell transistor MT. If there is a memory cell transistor MT that has not exceeded the verify point in a verify operation at time t4 as shown in FIG. 8, voltage generator 9 generates voltages obtained by adding voltage $V_{ST}$ to each of voltage V1 to V3. Specifically, voltage generator 9 applies voltage (V1+$V_{ST}$) to the control gate of memory cell transistor MT at time t5, voltage (V2+$V_{ST}$) to the control gate of memory cell transistor MT at time t6, and voltage (V3+$V_{ST}$) to the control gate of memory cell transistor MT at time t7.

If a verify operation at time t8 has shown that there is a memory cell that has not been written into yet, voltages obtained by adding 2×$V_{ST}$ to each of voltages V1 to V3 are applied and a write operation is repeated. For example, in period $L_n$, voltages obtained by adding (n−1)×$V_{ST}$ to each of voltages V1 to V3 are applied to memory cell transistor MT.

While in the second embodiment, voltage generator 9 has generated voltages V1 to V3 as write voltages Vpgm, this embodiment is not limited to this. For instance, voltage generator 9 may generate an n number of voltages as write voltages Vpgm. That is, voltage generator 9 may generate voltages V1 to Vn. In this case, the individual voltages satisfy the following expression: V1<V2<...<V(n−1)<Vn.

<Effect of the Second Embodiment>

A nonvolatile semiconductor memory device of the second embodiment and a method of writing the same produce the effect described in item (2).

(2) Operation Reliability May be Improved (Part 2)

With the nonvolatile semiconductor memory device of the second embodiment, not only voltage V2 explained in the first embodiment but also voltage V3 lower than voltages V1 and V2 is applied to memory cell transistor MT. By doing this, "0" data may be written into memory cell transistor MT where voltage $V_L$ has not exceeded the verify point with voltage V2, thereby narrowing the threshold level distribution of the memory cell transistor MT further. This is because the possibility that the threshold voltage of memory cell transistor MT holding "1" data will exceed voltage $V_H$ decreases as a result of the application of voltage V3 lower than voltage V2. Specifically, voltage (V1+$V_{ST}$) and voltage (V2+$V_{ST}$) are applied after a write verification operation in the first embodiment, thereby applying voltage V3 to memory cell transistor MT whose threshold voltage might exceed voltage $V_H$, which helps overcome the problem.

[Third Embodiment]

Next, a nonvolatile semiconductor memory device according to a third embodiment and a method of reading the same will be explained. The third embodiment is such that voltage generator 9 outputs voltage V1 as write voltage Vpgm to memory cell transistor MT and then cause voltage Vpgm to transit from voltage V1 to voltage V2 without applying zero potential to the memory cell transistor MT.

<Write Operation>

Figure 9:
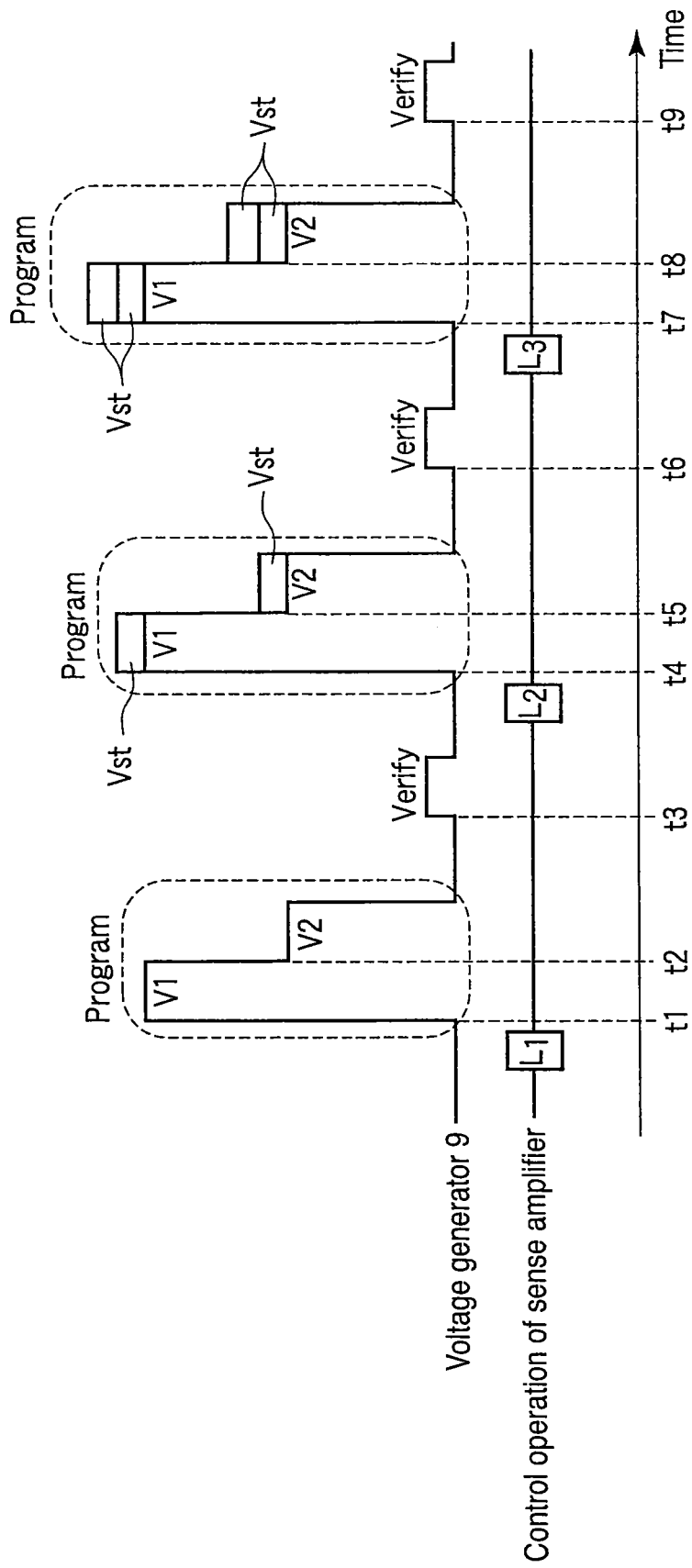
FIG. 9 is a time chart to explain voltage transfer in a voltage generator according to a third embodiment.

FIG. 9 is a timing chart to explain the way voltage generator 9 applies voltage Vpgm to the control gate of memory cell transistor MT corresponding to the selected word line WL via word line control circuit 2.

In the third embodiment, voltage V1 generated as voltage Vpgm by voltage generator 9 is caused to transit to voltage V2 without being lowered to 0 V as described above. As shown in FIG. 9, time is plotted on the abscissa axis and voltage is plotted on the ordinate axis. As in FIG. 6, if the low level is transferred to the gate of MOS transistor 23 in sense amplifier unit 3a, that is, in a write enable state (written as "Control operation of sense amplifier" in FIG. 9), voltage generator 9 applies write voltage Vpgm to the control gate of memory cell transistor MT. An explanation of the same operations as those of FIG. 6 will be omitted. Only the operations differing from those of FIG. 6 will be explained.

First, after period $L_1$ when control data unit 3b transferred the low level to the gate of MOS transistor 23, voltage V1 is generated at time t1 and voltage generator 9 lowers the output voltage from voltage V1 to voltage V2 at time t2. After the potential applied to the control gate of memory cell transistor MT is made zero, a verify operation is performed on the memory cell transistor MT at time t3. As shown in FIG. 9, if the verify operation at time t3 has shown that there is a memory cell transistor MT that has not exceeded the verify point, voltage $V_{ST}$ is added to voltages V1, V2 at time t4 and time t5, respectively. That is, voltage generator 9 applies voltage (V1+$V_{ST}$) at time t4 and voltage (V2+$V_{ST}$) at time t5. After a verify operation at time t6, if there is a memory cell that has not been written into yet, 2×$V_{ST}$ is added to each of voltages V1, V2 and a write verify operation is carried out. After period $L_n$, voltage (n−1)×$V_{ST}$ is added to each of voltages V1, V2 and a write verify operation is repeated.

<Effect of the Third Embodiment>

A nonvolatile semiconductor memory device of the third embodiment and a method of writing the same produce the effect described in item (3).

(3) Operation Speed May be Increased (Part 1)

With the nonvolatile semiconductor memory device of the third embodiment and the method of writing the same, after voltage V1 is transferred to word line WL and before voltage V2 is transferred, the potential of the word line WL is caused to transit from voltage V1 to voltage V2 without being lowered to 0 V temporarily, which shortens the write time. Therefore, the effect of increasing the writing speed may be expected. While in the third embodiment, voltage generator 9 causes the potential of word line WL to transit from voltage V1 to voltage V2 without lowering the potential to 0 V temporarily, it may cause the potential to transit from voltage V2 to voltage V3 (<voltage V2). In the write period $L_n$, an n number of write voltages Vn (<voltage V(n−1) may be transferred to word line WL. Not only the effect in item (3) but also the effects in times (1) and (2) may be expected at the same time, depending on the situation. That is, it is expected that the threshold level distribution of memory cell transistor MT will be narrowed so as to shorten the write time.

<First Modification>

Next, a nonvolatile semiconductor memory device according to a first modification of the first to third embodiments and a method of reading the same will be explained with reference to FIGS. 10 and 11. The first modification is such that a write verify operation is carried out only when voltage $V_H$ of a state distribution showing the threshold voltage of memory cell transistor MT crosses over the verify point in the first to third embodiments.

In the first embodiment, voltage V1 and voltage V2 lower than voltage V1 have been applied to the control gate of memory cell transistor MT corresponding to the selected word line WL at time t1 and time t2, respectively.

In contrast, in the first modification, voltage V1 is applied at time t1, time t2, and time t3. At time t5, time t6, and later, the operation is the same as at time t4 and later in the first embodiment. Explanation of the same operations as in FIG. 6 will be omitted. Only the operations differing from those of FIG. 6 will be explained.

Figure 10:
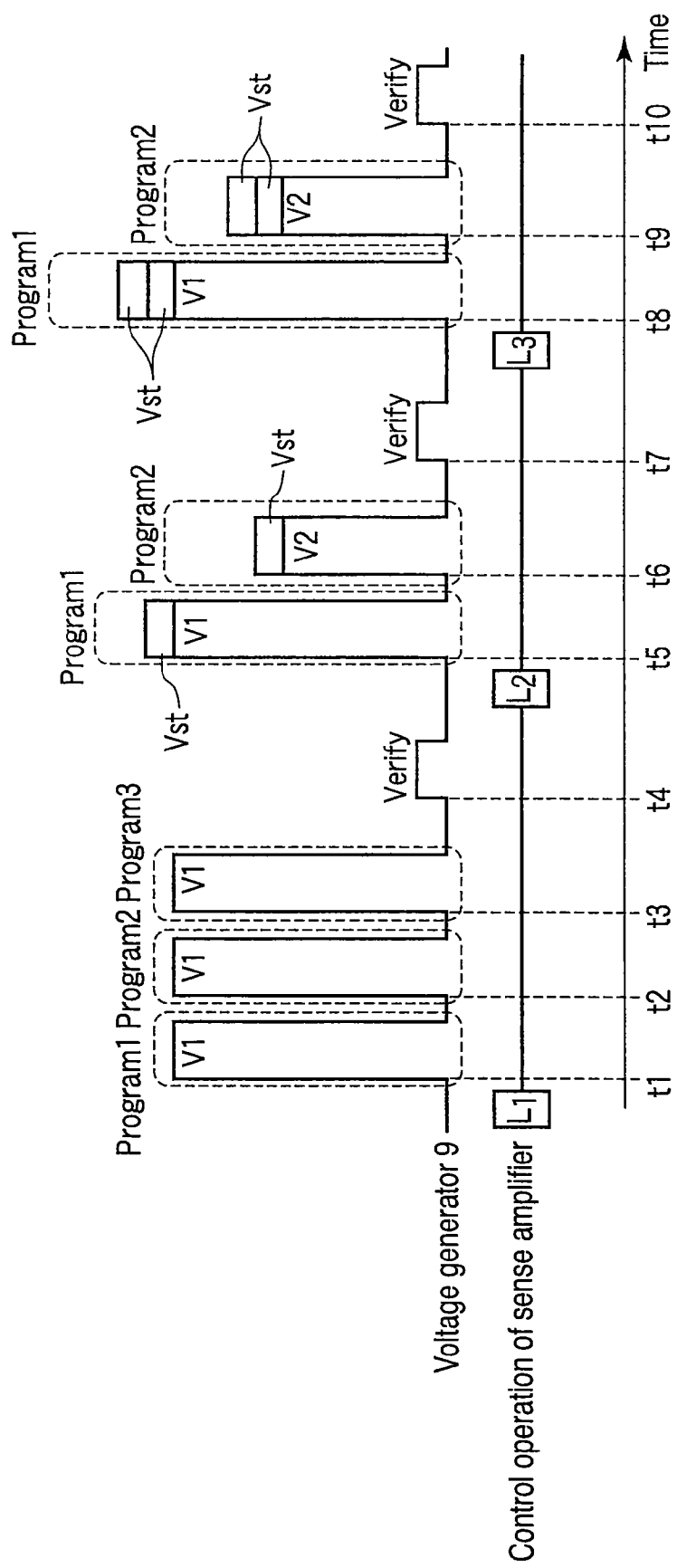
FIG. 10 is a time chart to explain voltage transfer in a voltage generator according to modification 1 of the first to third embodiments.
Figure 11A:
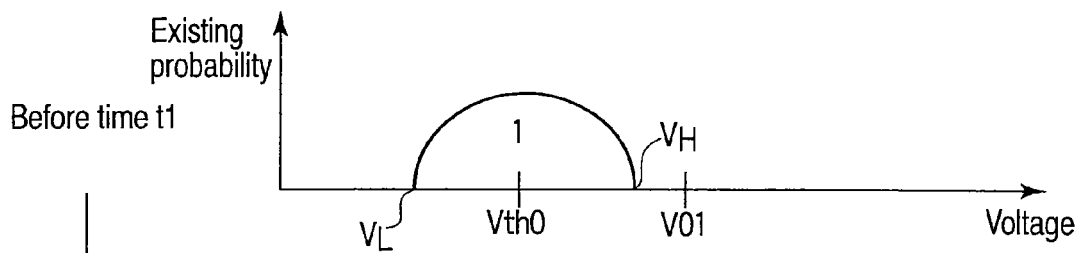
FIG. 11A, FIG. 11B, FIG. 11C, FIG. 11D and FIG. 11E are time charts to explain a variation in the threshold level of a memory cell transistor according to modification 1 of the first to third embodiments.
Figure 11B:
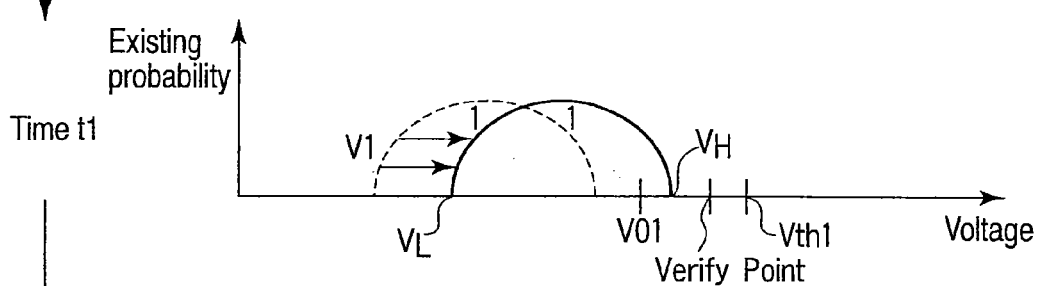
Figure 11C:
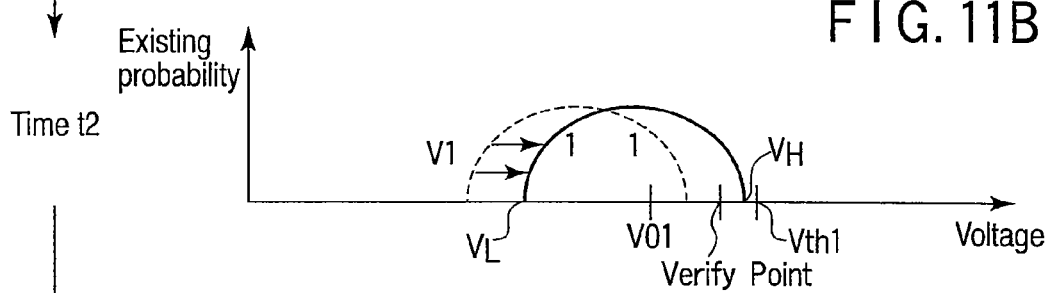
Figure 11D:
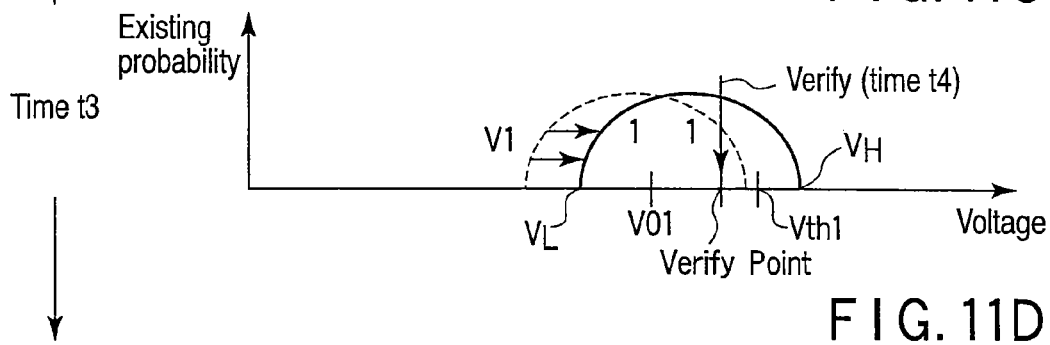
Figure 11E:
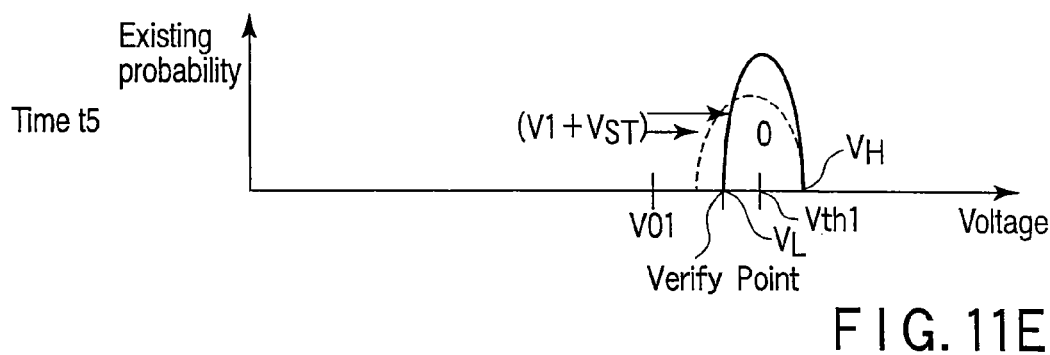

In a time between time t1 and time t3 during period $L_1$ in the writing state where control data unit 3b has transferred the low level to the gate of MOS transistor 23, voltage generator 9 applies voltage V1 to memory cell transistor MT a plurality of times (three times in FIG. 10).

A change in the threshold level distribution of memory cell transistor MT at this time will be explained with reference to FIG. 11. FIG. 11 shows a case where the threshold level of the memory cell transistor MT is varied from "1" data toward "0" data in the threshold level distribution of the memory cell transistor MT shown in FIG. 3. As shown in FIG. 11, write voltage V1 transferred from voltage generator 9 at times t1, t2 causes the threshold level distribution to vary (FIG. 11A to FIG. 11C in FIG. 11). Write voltage V3 at time t3 makes the high voltage side (written as $V_H$ in FIG. 11) of the threshold level distribution of memory cell transistor MT higher than the voltage used as the verify point. That is, "0" data has been written into any one of the memory cell transistors MT in NAND string 11.

Thereafter, a write verify operation is carried out at time t4. After that, the same operation as in the first embodiment is carried out and therefore explanation of it will be omitted. That is, not only (V1+$V_{ST}$) but also voltage (V2+$V_{ST}$) and the like are transferred to the memory cell transistor MT, with the result that the threshold level of the memory cell transistor MT has a distribution shown in FIG. 11E.

<Effect of the First Modification>

A nonvolatile semiconductor memory device of the first modification of the first to third embodiments and a method of writing the same produce the effect described in item (4).

(4) Operation Speed May be Increased

A specific length or more of time is required for charges to be injected into the charge storage layer of memory cell transistor MT. A write verify operation is performed on memory cell transistor MT by the time the specific length of time has elapsed, which increases the required time.

However, with the nonvolatile semiconductor memory device of the first modification, since memory cell transistor MT holds "0" data and does not carry out a write verify operation until NAND string 11 is turned on, the shortening of the required time may be expected.

While in the first modification, voltage generator 9 has applied pulsed write voltage V1 to word line WL three times in a time between time t1 and time t3, the pulsed write voltage may be applied once. In this case, the period during which voltage V1 is applied to word line WL is made longer.

Furthermore, voltage V1 and voltage V2 shaped as explained in the third embodiment may be applied at time t5 and time t6, respectively. In other words, voltages may be transferred so as to change continuously from voltage V1 to voltage v2.

<Second Modification>

Next, a nonvolatile semiconductor memory device according to a second modification of the first and second embodiments and a method of reading the same will be explained with reference to FIG. 12. The second modification is such that voltage $V_{ST}$ is not added to voltage V2 after a write verify operation and the voltage pulse width of voltage V2 is increased in the first and second embodiments. The pulse width may be increased at regular intervals or in increments of other widths.

Figure 12:
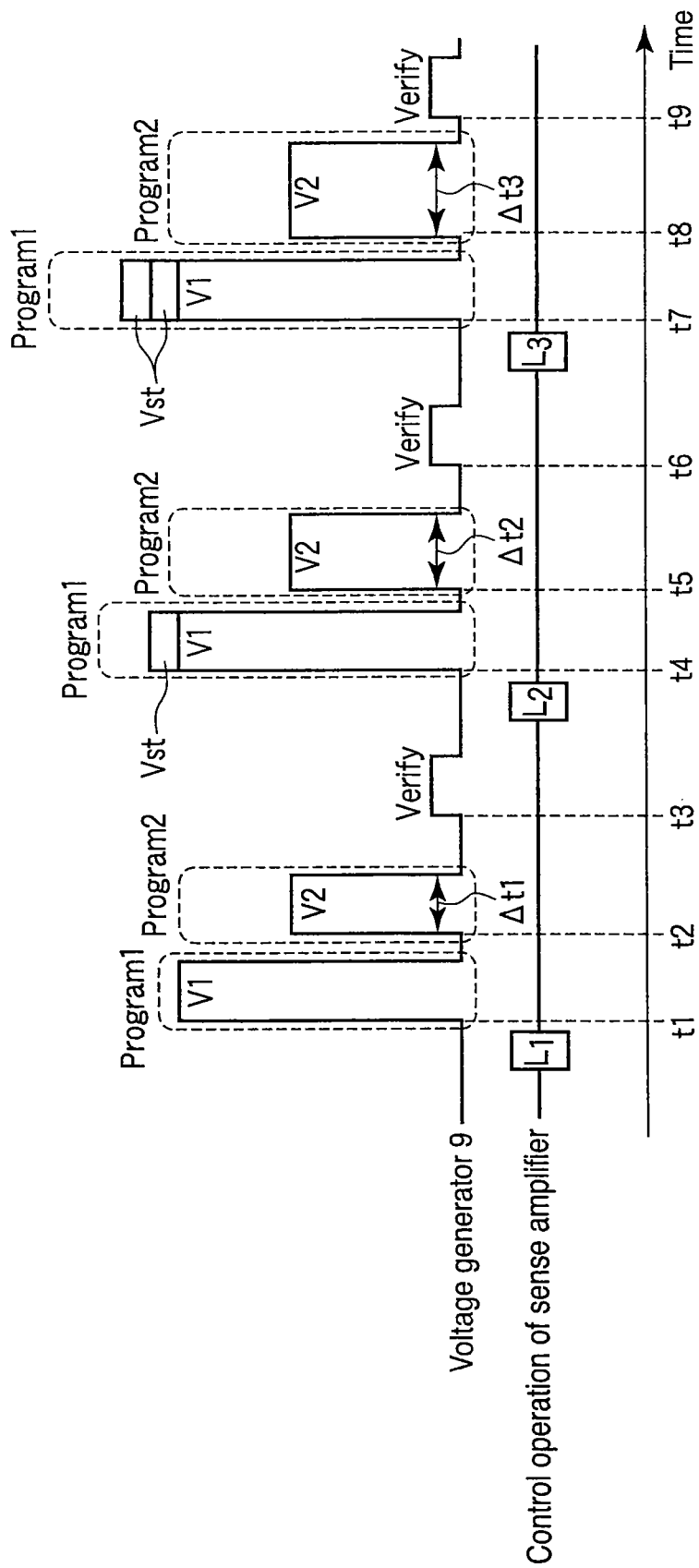
FIG. 12 is a time chart to explain voltage transfer in a voltage generator according to modification 2 of the first and second embodiments.

FIG. 12 is a timing chart to explain the way voltage Vpgm generated by voltage generator 9 is transferred to the control gate of memory cell transistor MT corresponding to the selected word line WL via word line control circuit 2. Voltage generator 9 generates voltages V1 and V2 as voltages Vpgm, with the voltage pulse width of voltage V2 made longer. As shown in FIG. 12, time is plotted on the abscissa axis and voltage is plotted on the ordinate axis. As in FIG. 6, if the low level is transferred to the gate of MOS transistor 23 in sense amplifier unit 3a, that is, in a writing state (written as "Control operation of sense amplifier" in FIG. 12), voltage generator 9 applies write voltage Vpgm to the control gate of memory cell transistor MT. An explanation of the same operations as those of FIG. 6 will be omitted. Only the operations differing from those of FIG. 6 will be explained.

Since the operations in a time between time t1 and time t4 are the same as in the first embodiment, explanation of them will be omitted. At time t5, voltage generator 9 outputs voltage V2 during a period of Δt2 (>Δt1). Δt1 is a period during which voltage V2 at time t2 is applied. At time t8, voltage generator 9 outputs voltage V2 during a period of Δt3 (>Δt2). Hereinafter, if the pulse width of an n-th voltage V2 (n is a natural number) is Δtn, voltage generator 9 generates a voltage satisfying the expression Δtn>Δt(n−1).

<Effect of the Second Embodiment>

A nonvolatile semiconductor memory device of the second modification and a method of writing the same produce the effect described in item (1). In the second modification, voltage V1 has been stepped up by voltage $V_{ST}$ and the value of voltage V2 is caused to remain unchanged and the application time of voltage V2 is made longer. Accordingly, it is possible to control a change in the threshold voltage minutely as compared with a case where voltage V2 is raised. Consequently, the threshold level distribution of memory cell transistor MT may be narrowed.

(Example of Application)

Next, an application to which the semiconductor memory device and the method of writing the same are applied will be explained with reference to FIG. 13. FIG. 13 shows an example of a memory card to which the semiconductor memory device is applied. In FIG. 13, a memory card 900, which comprises a semiconductor memory device 901 including a NAND flash memory explained in the embodiments, receives a specific control signal and data from an external unit (not shown). The memory card 900 outputs a specific control signal and data to an external unit (not shown).

Specifically, a signal line (DAT) for transferring data, addresses, or commands, a command line enable signal line (CLE) which indicates that a command is transferred to signal line DAT, an address line enable signal line (ALE) which indicates that an address is transferred to signal line DAT, and a ready busy signal line (R/B) which indicates whether flash memory 10 may be operated are connected to the semiconductor memory device 901 mounted on the memory card 900.

FIG. 14 shows another example of the memory card. This memory card differs from that of FIG. 13 in that the card includes a controller 910 which controls flash memory 3 and exchanges a signal with an external unit (not shown).

The controller 910 comprises an interface module (I/F) 911 which receives a signal from, for example, an external unit (not shown) or outputs a signal to an external unit, an interface module 912 which exchanges a signal with the semiconductor memory device 901 including NAND flash memory, a microprocessor (MPU) 913 which performs calculations, including the conversion of a logical address input from an external unit into a physical address, a RAM 914 acting as a buffer for storing data temporarily, and an error correction module (ECC) 915 which generates an error correction code.

A command signal line (CMD), a clock signal line (CLK), and a signal line (DAT) are connected to the interface module 911 of the memory card 900.

In the memory card, the number of various signal lines, the bit width of signals lines, and the configuration of the controller may be modified. The use of this configuration enables a solid state drive (SSD) to be configured in place of a hard disk.

FIG. 15 shows another application. As shown in FIG. 15, the memory card 900 is inserted into a card holder 920, thereby connecting with an electronic device (not shown). The card holder 920 may have a part of the function of controller 910.

FIG. 16 shows another application. Either memory card 900 or card holder 920 into which the memory card 900 has been inserted is inserted into a connection device 1000. The connection device 1000 is connected to a board 1300 via connecting wires 1100 and an interface circuit 1200. A CPU 1400 and a bus 1500 are mounted on the board 1300.

Figure 17:
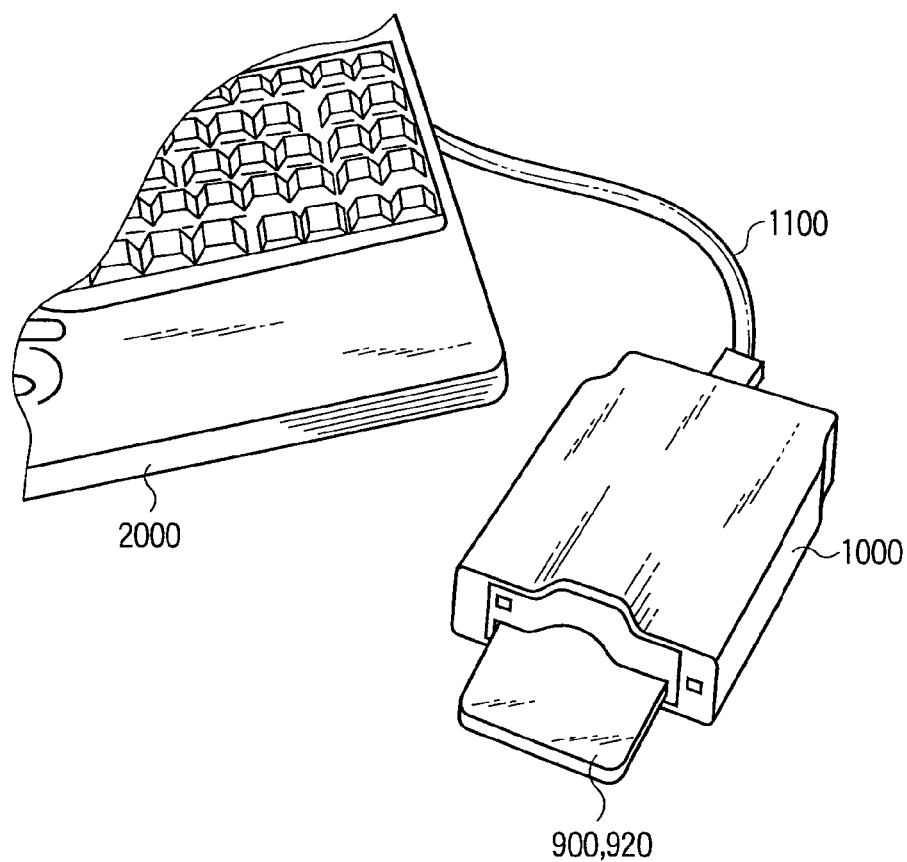

FIG. 17 shows another application. Either memory card 900 or card holder 920 into which the memory card 900 has been inserted is inserted into a connection device 1000. The connection device 1000 is connected to a personal computer 2000 via connecting wires 1100.

Figure 18:
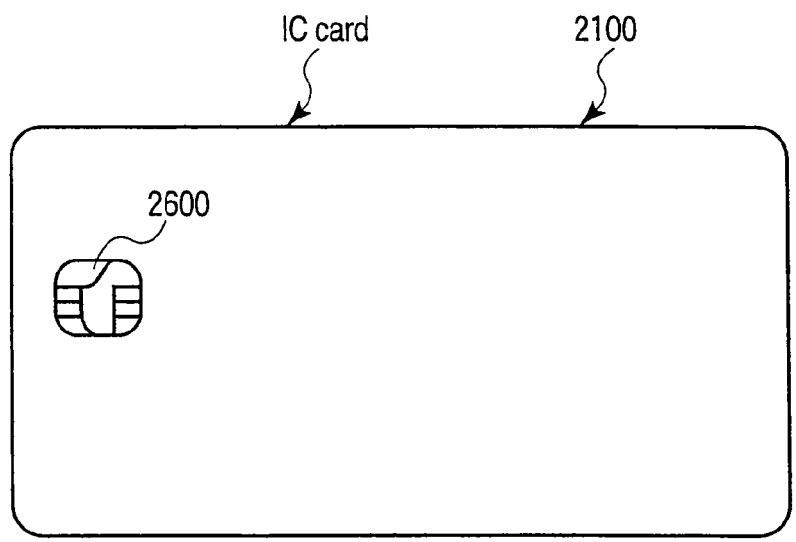
Figure 19:
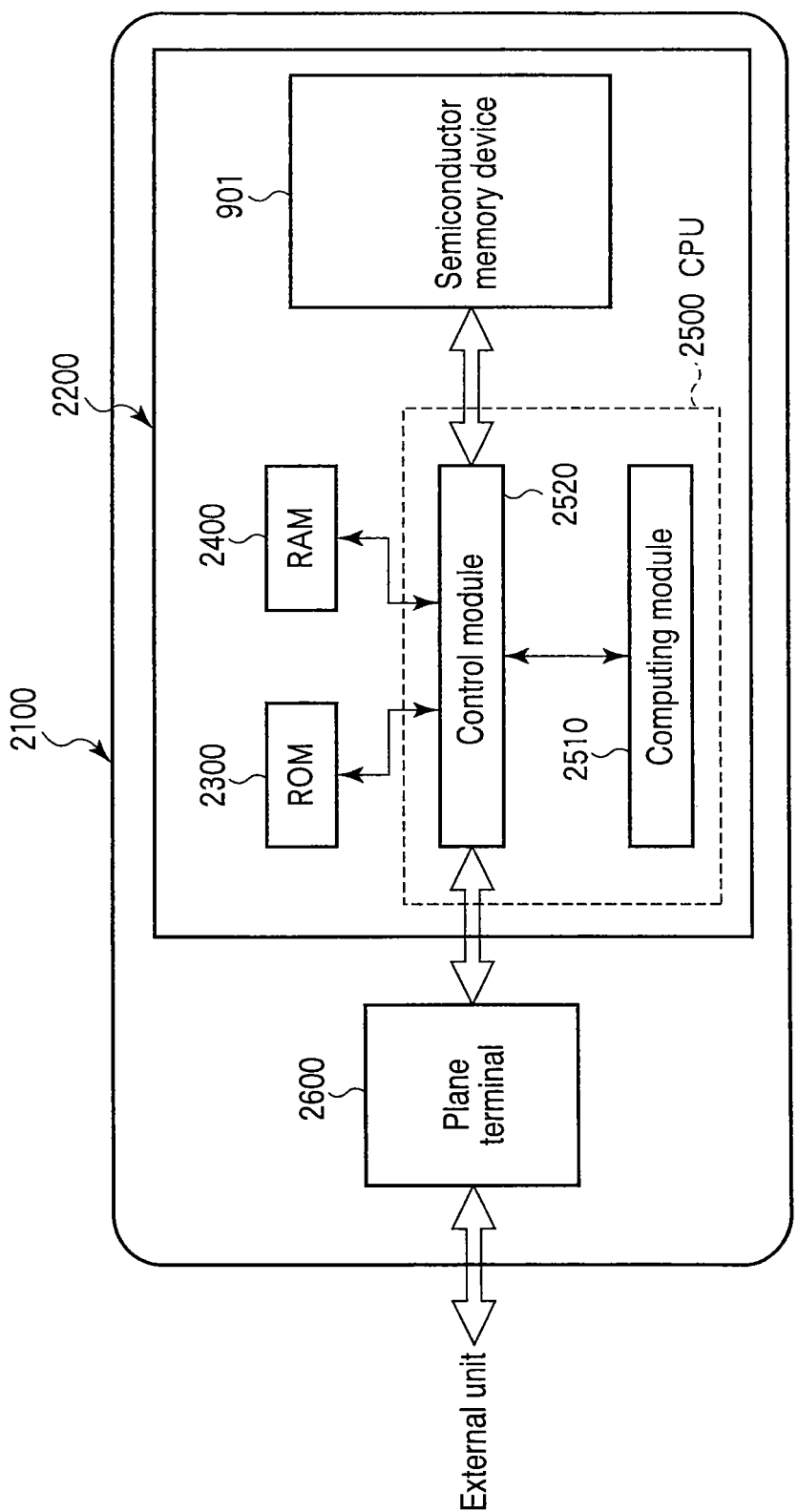

FIGS. 18 and 19 show another application. As shown in FIGS. 18 and 19, an IC card 2100 is provided with an MCU 2200. MCU 2200 comprises a semiconductor memory device 901 including a NAND flash memory according to the first to third embodiments and a ROM 2300, a RAM 2400, and a CPU 2500. The IC card 2100 includes a plane terminal 2600 exposed at one surface of the card 2100 as shown in FIG. 18. The plane terminal 2600 is connected to MCU 2200. CPU 2500 comprises a computing module 2510 and a control module 2520 connected to the flash memory 3, ROM 2300, and RAM 2400.

Figure 20:
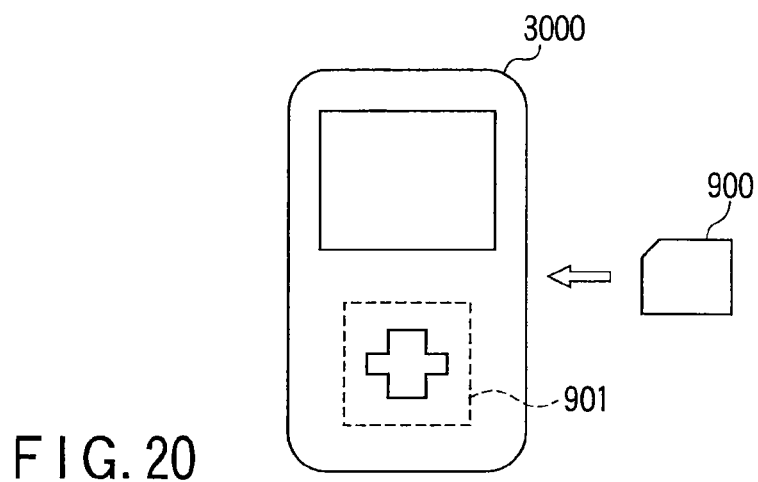

FIG. 20 shows another application, such as a portable audio recording and reproducing device 3000. The portable audio recording and reproducing device 3000 includes a semiconductor memory device 901 including a NAND flash memory according to the first to third embodiments. A memory card 900 including the NAND flash memory may be installed in the recording and reproducing device 3000.

Figure 21:
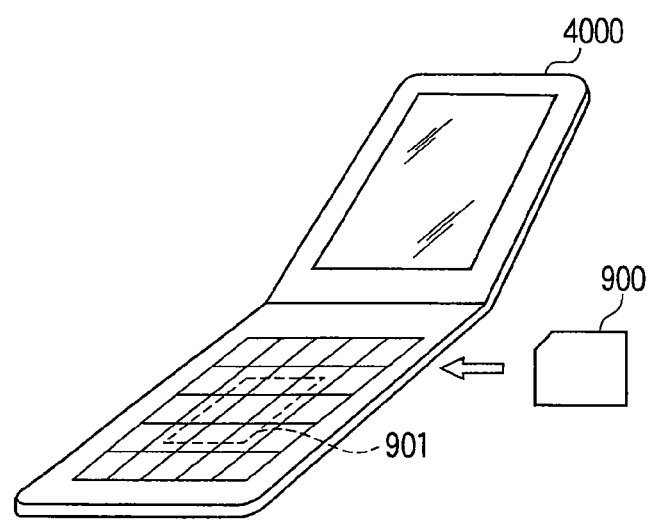

FIG. 21 shows another application. The application is, for example, a mobile terminal device 4000, such as a mobile phone. The mobile terminal device 4000 includes a semiconductor memory device 901 including a NAND flash memory according to the first to third embodiments. A memory card 900 including the NAND flash memory may be installed in the mobile terminal device 4000.

Figure 22:
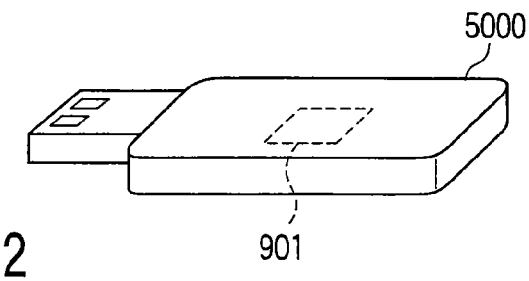

FIG. 22 shows another application, such as a USB memory 5000. The USB memory 5000 includes a semiconductor memory device 901 including a NAND flash memory according to the first to third embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a memory cell array which includes a plurality of memory cells;
   word lines electrically connected to the memory cells;
   a controller configured to perform a write operation, the write operation including a first program operation, a second program operation, a third program operation, a fourth program operation, and a first verify operation,
   the controller configured to perform the first program operation on a condition a first voltage is applied to a selected word line,
   the controller configured to perform the second program operation on a condition a second voltage is applied to the selected word line after the first program operation, the second voltage being lower than the first voltage,
   the controller configured to perform the first verify operation on a condition a third voltage is applied to a selected word line after the second program operation,
   the controller configured to perform the third program operation on a condition a fourth voltage is applied to the selected word line after the first verify operation, the fourth voltage being higher than the first voltage,
   the controller configured to perform the fourth program operation on a condition a fifth voltage is applied to the selected word line after the third program operation, the fifth voltage being higher than the second voltage and lower than the fourth voltage.

2. The device according to claim 1, wherein the controller is configured to perform a second verify operation on a condition a sixth voltage is applied to the selected word line after the fourth program operation.

3. The device according to claim 1,
   wherein the controller is configured to control a voltage applied to the selected word line from the first voltage to the second voltage without lowering the voltage applied to the selected word line to zero, and
   the controller is configured to control a voltage applied to the selected word line from the fourth voltage to the fifth voltage, the fourth voltage being higher than the first voltage, the fifth voltage being higher than the second voltage and lower than the fourth voltage.

4. The device according to claim 2, wherein the controller is configured to perform a fifth program operation on a condition a seventh voltage is applied to the selected word line after the second verify operation, the seventh voltage being higher than the fourth voltage.

5. The device according to claim 4, wherein the controller is configured to perform a sixth program operation on a condition an eighth voltage is applied to the selected word line after the fifth program operation, the eighth voltage being higher than the fifth voltage and lower than the seventh voltage.

6. The device according to claim 1, further comprising:
   a voltage generator,
   wherein the controller controls the voltage generator to shift an output voltage from the first voltage to the second voltage without lowering the output voltage to zero, and then from the fourth voltage higher than the first voltage by the third voltage to the fifth voltage higher than the second voltage by the third voltage and lower than the fourth voltage.

7. A method of writing a nonvolatile semiconductor memory device, the method comprising:
   performing first writing by applying a first voltage and a second voltage lower than the first voltage to memory cells each of which includes a charge storage layer and a control gate and is capable of holding two or more levels of data;
   performing a first verify operation on the memory cells;
   performing second writing by applying to the memory cells a fourth voltage higher than the first voltage by a third voltage and then a fifth voltage higher than the second voltage by the third voltage and lower than the fourth voltage after the verify operation has been performed on the memory cells; and
   performing a second verify operation on a condition a sixth voltage is applied to the memory cell after the second writing.

8. The method according to claim 7, further comprising:
   shifting an output voltage from the first voltage to the second voltage without lowering the output voltage to zero and then from the fourth voltage to a fifth voltage, the fourth voltage being higher than the first voltage, the fifth voltage being higher than the second voltage and lower than the fourth voltage.

9. The method according to claim 7, further comprising:
   performing a third writing by applying to the memory cells a seventh voltage higher than the fourth voltage and then an eighth voltage higher than the fifth voltage and lower than the seventh voltage after the second verify operation has been performed on the memory cells.

* * * * *